(12) United States Patent
Lin et al.

(10) Patent No.: US 11,942,380 B2
(45) Date of Patent: Mar. 26, 2024

(54) SEMICONDUCTOR STRUCTURE AND TESTING METHOD THEREOF

(71) Applicant: TAIWAN SEMICONDUCTOR MANUFACTURING CO., LTD., Hsinchu (TW)

(72) Inventors: Ming-Shiang Lin, Hsinchu (TW); Chia-Cheng Ho, Hsinchu (TW); Chun-Chieh Lu, Taipei (TW); Cheng-Yi Peng, Taipei (TW); Chih-Sheng Chang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 723 days.

(21) Appl. No.: 17/080,625

(22) Filed: Oct. 26, 2020

(65) Prior Publication Data

US 2021/0057290 A1    Feb. 25, 2021

Related U.S. Application Data

(63) Continuation of application No. 16/020,860, filed on Jun. 27, 2018, now Pat. No. 10,818,562.

(60) Provisional application No. 62/593,124, filed on Nov. 30, 2017.

(51) Int. Cl.
| | | |
|---|---|---|
| H01L 29/417 | (2006.01) |
| G01R 27/26 | (2006.01) |
| H01L 21/283 | (2006.01) |
| H01L 21/306 | (2006.01) |
| H01L 21/324 | (2006.01) |
| H01L 21/66 | (2006.01) |
| H01L 29/66 | (2006.01) |

(52) U.S. Cl.
CPC .......... *H01L 22/14* (2013.01); *G01R 27/2617* (2013.01); *H01L 22/34* (2013.01)

(58) Field of Classification Search
CPC ............. H01L 29/66795; H01L 29/785; H01L 29/66545; H01L 21/823431; H01L 21/324
See application file for complete search history.

(56) References Cited

U.S. PATENT DOCUMENTS

| | | | |
|---|---|---|---|
| 6,274,454 B1 | 8/2001 | Katori | |
| 6,864,109 B2 | 3/2005 | Chang | |
| 9,275,905 B1* | 3/2016 | Wen | ...................... H01L 29/161 |
| 9,324,820 B1* | 4/2016 | Kelly | .................. H01L 29/7848 |
| 10,121,875 B1 | 11/2018 | Ho | |
| 10,276,697 B1* | 4/2019 | Lu | ..................... H01L 29/66795 |
| 11,139,432 B1* | 10/2021 | Liu | ...................... H10N 70/253 |
| 2009/0058456 A1 | 3/2009 | Okayasu | |
| 2015/0287802 A1 | 10/2015 | Lee | |
| 2015/0377796 A1 | 12/2015 | Schlezinger | |
| 2016/0225775 A1 | 8/2016 | Park | |

(Continued)

*Primary Examiner* — Anthony Ho
*Assistant Examiner* — David J Goodwin
(74) *Attorney, Agent, or Firm* — Maschoff Brennan

(57) ABSTRACT

A method includes forming a dummy pattern over test region of a substrate; forming an interlayer dielectric (ILD) layer laterally surrounding the dummy pattern; removing the dummy pattern to form an opening; forming a dielectric layer in the opening; performing a first testing process on the dielectric layer; performing an annealing process to the dielectric layer; and performing a second testing process on the annealed dielectric layer.

20 Claims, 32 Drawing Sheets

(56) References Cited

U.S. PATENT DOCUMENTS

| | | |
|---|---|---|
| 2016/0308070 A1 | 10/2016 | Chang |
| 2017/0162250 A1 | 6/2017 | Slesazeck |
| 2019/0019875 A1 | 1/2019 | Tsai |
| 2019/0027601 A1 | 1/2019 | Gao |
| 2019/0131426 A1 | 5/2019 | Lu |

* cited by examiner

US 11,942,380 B2

SEMICONDUCTOR STRUCTURE AND TESTING METHOD THEREOF

PRIORITY CLAIM AND CROSS-REFERENCE

This application is a continuation application of U.S. patent application Ser. No. 16/020,860, filed Jun. 27, 2018, now U.S. Pat. No. 10,818,562, issued Oct. 27, 2020, which claims priority to U.S. Provisional Application Ser. No. 62/593,124, filed Nov. 30, 2017, which are herein incorporated by references.

BACKGROUND

The metal-oxide-semiconductor (MOS) is a technology for integrated circuits at 90 nm technology and beyond. A MOS device can work in three regions, depending on gate voltage $V_g$ and source-drain voltage $V_{ds}$, linear, saturation, and sub-threshold regions. The sub-threshold region is a region where $V_g$ is smaller than the threshold voltage $V_t$. The sub-threshold swing represents the easiness of switching the transistor current off and thus is a factor in determining the speed of a MOS device. The sub-threshold swing can be expressed as a function of m*kT/q, where m is a parameter related to capacitance. The sub-threshold swing of a MOS device has a limit of about 60 mV/decade (kT/q) at room temperature, which in turn sets a limit for further scaling of operation voltage VDD and threshold voltage $V_t$. This limitation is due to the drift-diffusion transport mechanism of carriers. For this reason, existing MOS devices are hard to switch faster than 60 mV/decade at room temperatures. The 60 mV/decade sub-threshold swing limit also applies to FinFET or ultra thin-body MOSFET on silicon-on-insulator (SOI) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
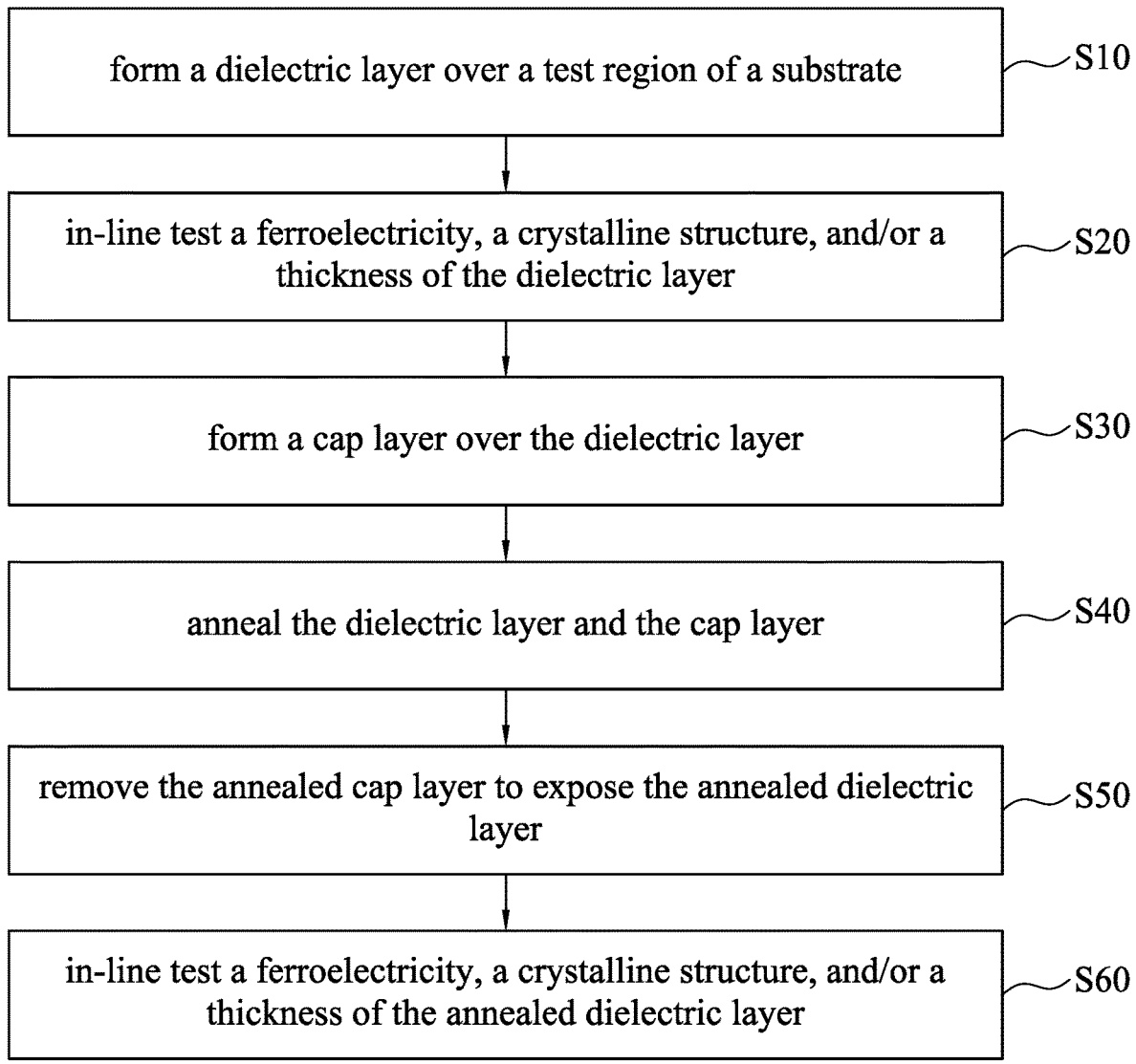
FIG. 1 is a flowchart of a testing process in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide some improved methods for the formation of semiconductor devices and the resulting structures. These embodiments are discussed below in the context of forming finFET transistors having a single fin or multiple fins on a bulk silicon substrate.

Embodiments of the present disclosure relate to test patterns and manufacturing methods by performing in-line monitor tests on the test patterns to monitor the negative-capacitance properties of semiconductor devices during manufacturing the semiconductor devices. FIG. 1 is a flowchart of a testing process in accordance with some embodiments of the present disclosure. Operation S10 forming a dielectric layer over a test region of a substrate. Operation S20 is in-line testing a ferroelectricity, a crystalline structure, and/or a thickness of the dielectric layer in the opening. Here, in-line testing means testing during fabrication. In the operation S20, the dielectric layer is expected to be paraelectric and have an amorphous crystalline structure and a certain thickness. If the dielectric layer is not paraelectric and/or have other kind of crystalline structure, the dielectric layer can be considered failed in some embodiments. Operation S30 is forming a cap layer over the dielectric layer. Operation S40 is annealing the dielectric layer and the cap layer. Operation S50 is removing the annealed cap layer to expose the annealed dielectric layer. Operation S60 is testing a ferroelectricity, a crystalline structure, and/or a thickness of the annealed dielectric layer. In the operation S60, the annealed dielectric layer is expected to be ferroelectric and have an orthorhombic crystalline structure and the certain thickness. If the annealed dielectric layer is not ferroelectric and/or have other kind of crystalline structure, the annealed dielectric layer can be considered failed in some embodiments. The annealed dielectric layer provides a negative capacitance and thus can be used as a layer of a gate to lower the subthreshold swing (SS) of the device. With this process, the properties (such as ferroelectricity and crystalline structure) of the (annealed) dielectric layer can be studied and controlled during the fabrication and with short cycle time and low cost.

In some embodiments, the operations S20 and S60 can be piezoresponse force microscopy (PFM) measurement processes, such that the ferroelectricity of the dielectric layer can be obtained. The PFM is a scanning probe microscopy (SPM) technique in which periodic bias is applied to a conductive tip in contact with a surface. The bias results in periodic surface displacement due to inverse piezoelectric effect or electrostriction of a ferroelectric surface. Mapping of the amplitude and phase of the displacement provides information of ferroelectric-paraelectric domain structures.

In some embodiments, the operations S20 and S60 can be X-ray diffraction (XRD) measurement processes, such that the crystalline structure of the dielectric layer can be obtained. XRD is a technique for studying the crystalline structure of a structure. In XRD, a sample is irradiated by a monochromatic X-ray beam, and the locations and intensities of the diffraction peaks are measured. The characteristic diffraction angles and the intensity of the diffracted radiation depend on the lattice planes of the sample under study and the atoms that make up the crystalline material. For a given wavelength and lattice plane spacing, diffraction peaks will be observed when the X-ray beam is incident on a lattice plane at angles that satisfy the Bragg condition.

In some embodiments, the operations S20 and S60 can be ellipsometry measurement processes, such that the thickness of the dielectric layer can be obtained. Ellipsometry is a sensitive sample analysis technique which can be done non-destructively on most samples. During an ellipsometry experiment, light of one or more wavelengths is reflected from a surface of a sample, or transmitted through the sample and out the other side. Reflected light is more often analyzed. The information ellipsometry provides characterizes the surface of the sample near the reflection since the reflected light typically interacts less with the sample material away from the surface.

In some embodiments, a variety of operations S20 (S60) are performed. For example, the PFM measurement, the XRD measurement, and the ellipsometry measurement are performed during the operation S20 (S60). As such, the ferroelectricity, the crystalline structure, and the thickness of the dielectric layer can be obtained.

Figure 2A:
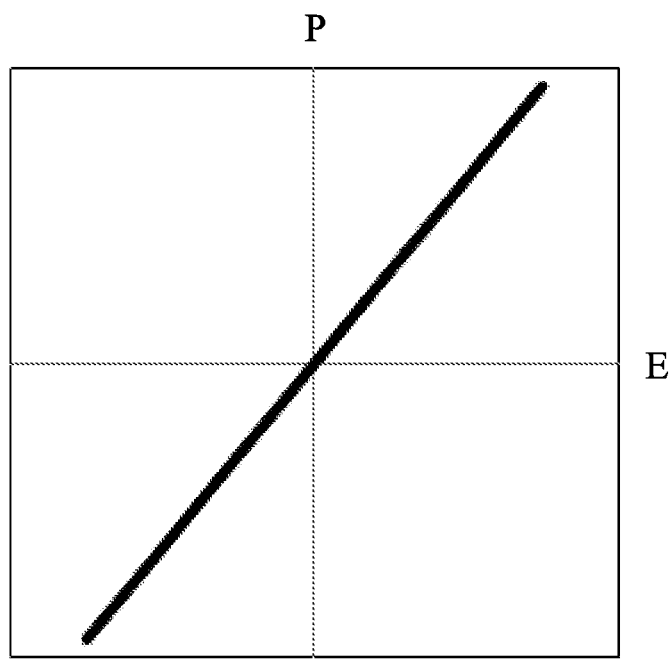
FIG. 2A is a polarization-electric field curve of the dielectric layer during an operation S20 of FIG. 1.
Figure 2B:
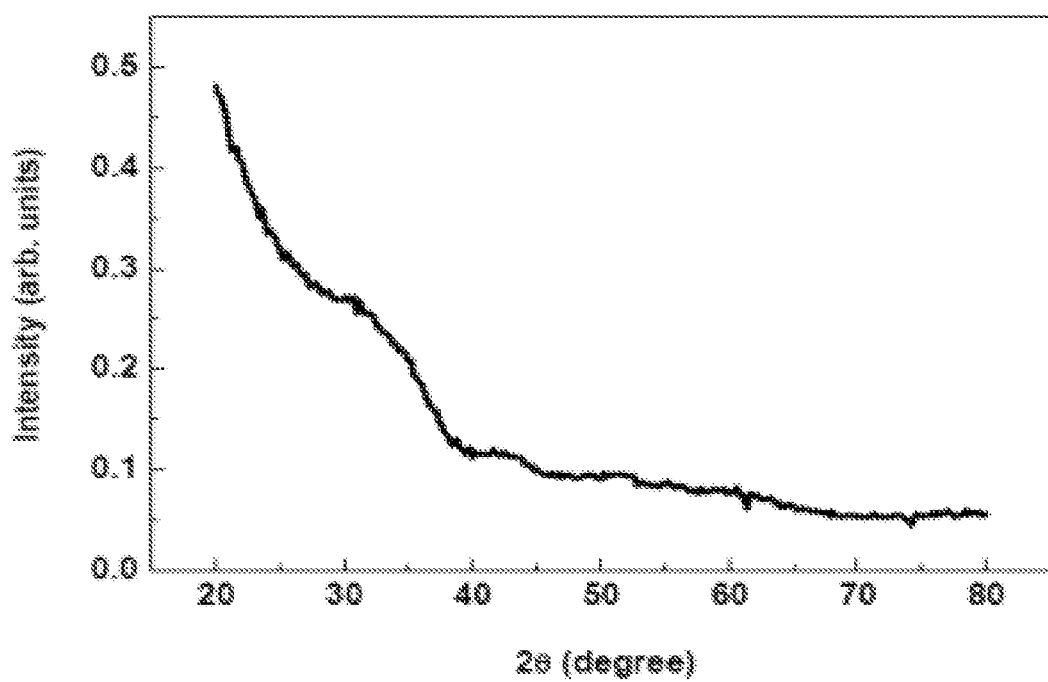
FIG. 2B is an x-ray diffraction pattern of the dielectric layer during the operation S20 of FIG. 1.

FIG. 2A is a polarization-electric field curve of the dielectric layer during the operation S20 of FIG. 1, and FIG. 2B is an x-ray diffraction pattern of the dielectric layer during the operation S20 of FIG. 1. In this stage, the dielectric layer is expected to be paraelectric (as shown in FIG. 2A) and have an amorphous crystalline structure (as shown in FIG. 2B) and a certain thickness. In some embodiments, the dielectric layer has a thickness in a range of about 0.1 nm to about 50 nm. If the dielectric layer is not paraelectric and/or have other kind of crystalline structure, the dielectric layer can be considered failed in some embodiments.

Figure 3A:
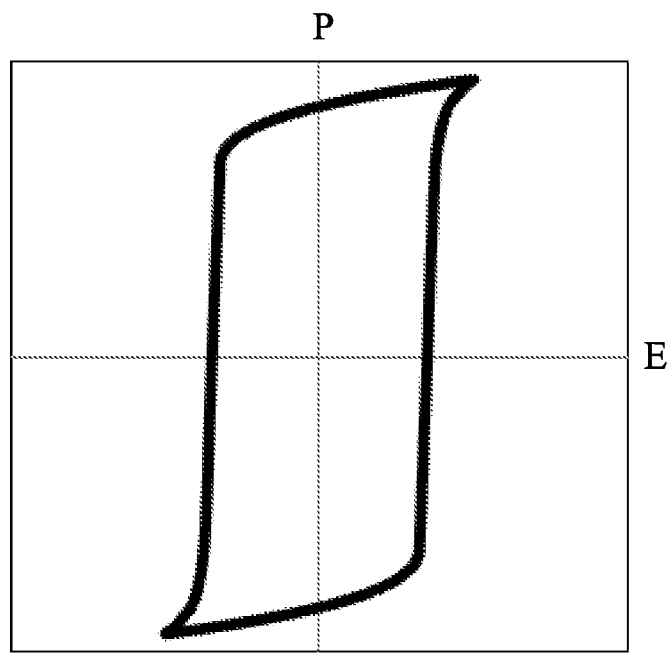
FIG. 3A is a polarization-electric field curve of the annealed dielectric layer during an operation S60 of FIG. 1.
Figure 3B:
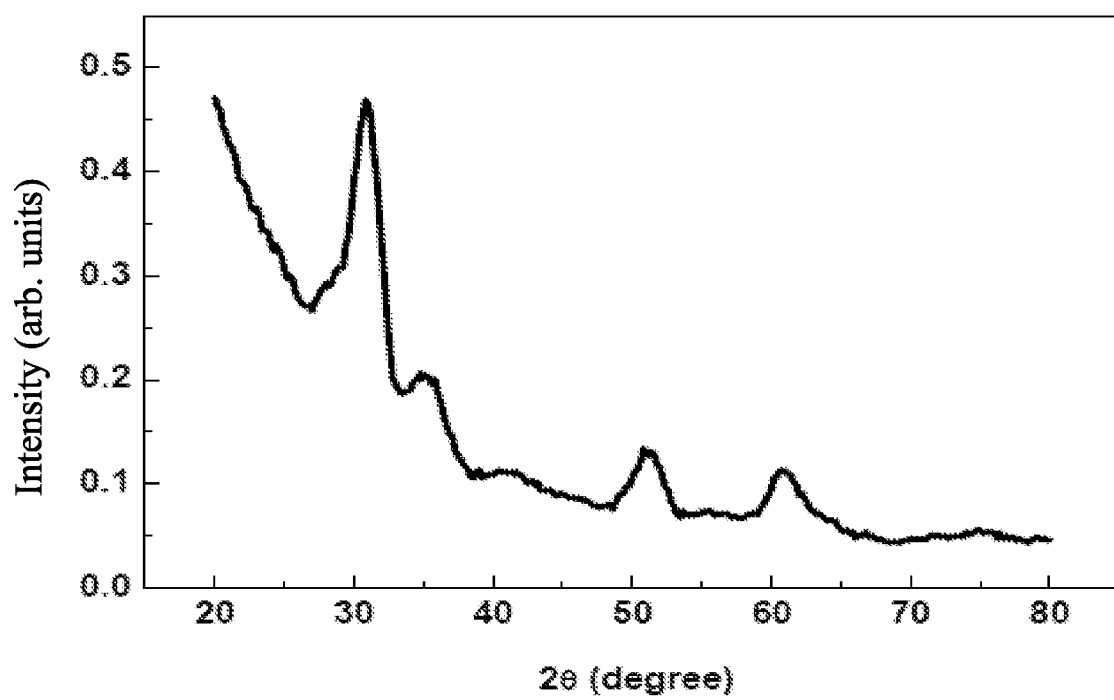
FIG. 3B is an x-ray diffraction pattern of the annealed dielectric layer during the operation S60 of FIG. 1.

FIG. 3A is a polarization-electric field curve of the dielectric layer during the operation S60 of FIG. 1, and FIG. 3B is an x-ray diffraction pattern of the dielectric layer during the operation S60 of FIG. 1. In this stage, the annealed dielectric layer is expected to be ferroelectric (as shown in FIG. 3A) and have an orthorhombic crystalline structure (as shown in FIG. 3B), and the thickness of the annealed dielectric layer is expected to be the thickness of the dielectric layer in operation S20. If the annealed dielectric layer is not paraelectric and/or have other kind of crystalline structure, the annealed dielectric layer can be considered failed in some embodiments.

FIGS. 4, 5, 6A, 7, 8A, 10, 11A, 12A, 13A, 14A, 15A, and 16A are perspective views of a method for manufacturing a semiconductor structure at various stages in accordance with some embodiments of the present disclosure. In some embodiments, the semiconductor device as shown in FIGS. 4, 5, 6A, 7, 8A, 10, 11A, 12A, 13A, 14A, 15A, and 16A may be intermediate devices fabricated during processing of an IC, or a portion thereof, that may include static random access memory (SRAM) and/or logic circuits, passive components such as resistors, capacitors, and inductors, and active components such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 4:
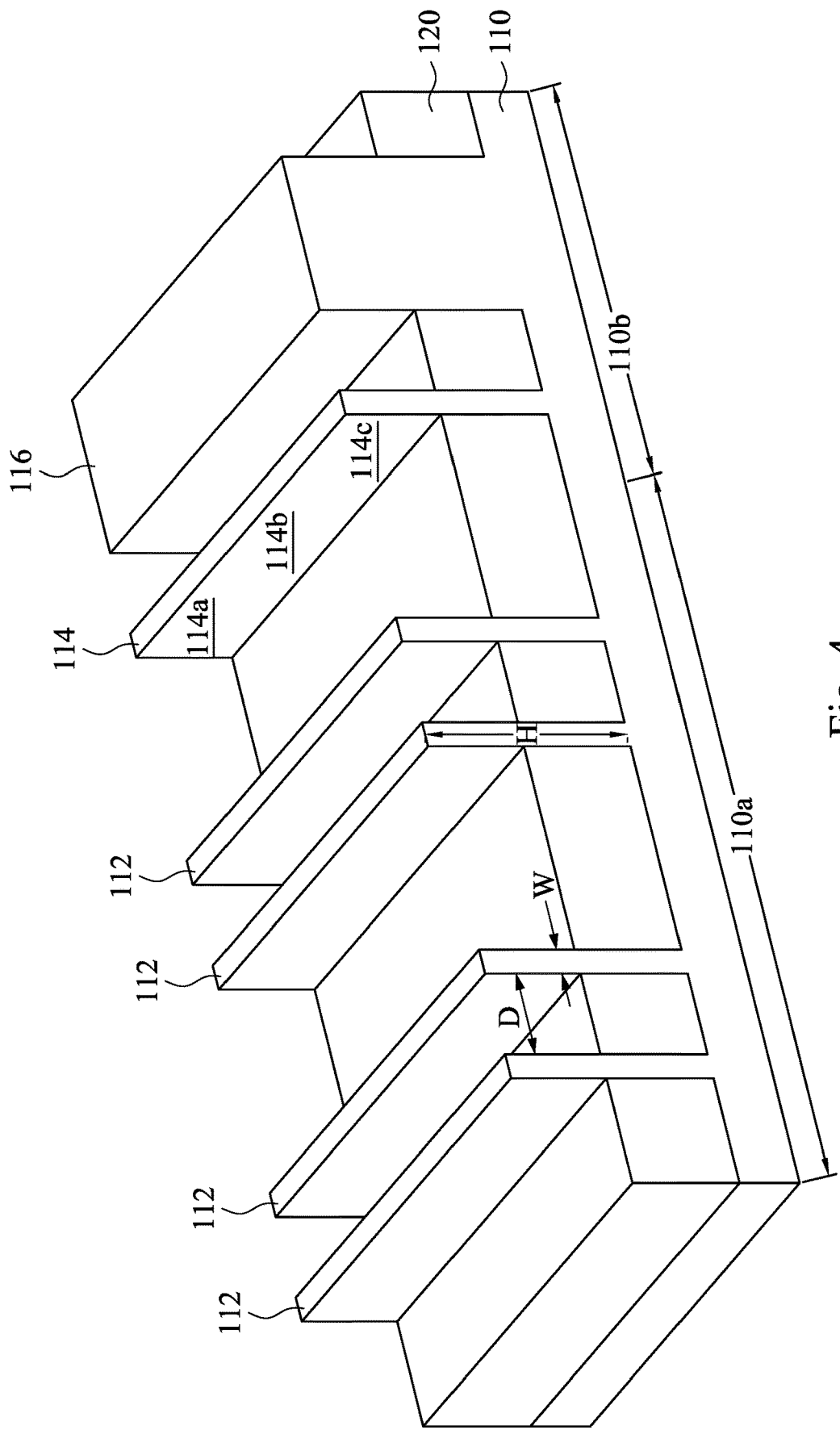
FIGS. 4, 5, 6A, 7, 8A, 10, 11A, 12A, 13A, 14A, 15A, and 16A are perspective views of a method for manufacturing a semiconductor device at various stages in accordance with some embodiments of the present disclosure.

Reference is made to FIG. 4. A substrate 110 is provided. The substrate 110 includes a device region 110a and a test region 110b adjacent to the device region 110a. In some embodiments, the substrate 110 may include silicon (Si). Alternatively, the substrate 110 may include germanium (Ge), silicon germanium, gallium arsenide (GaAs), germanium-tin (GeSn), or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

The substrate 110 further includes a plurality of semiconductor fins 112 and 114 and a testing feature 116 protruded from the substrate 110. The semiconductor fins 112 are disposed in the device region 110a and serve as source/drain features of transistors, and the semiconductor fin(s) 114 and the testing feature 116 are disposed in the test region 110b and serves as bases of test structures for the following test process. It is note that the numbers of the semiconductor fins 112 and 114 and the testing feature 116 in FIG. 4 are illustrative, and should not limit the claimed scope of the present disclosure. A person having ordinary skill in the art may select suitable numbers for the semiconductor fins 112 and 114 and the testing feature 116 according to actual situations. The semiconductor fin 114 includes a first portion 114a, a second portion 114b, and a third portion 114c, and the second portion 114b is between the first portion 114a and the third portion 114c. In some embodiments, the sizes of the semiconductor fin 114 and the testing feature 116 are greater than the size of the semiconductor fins 112. For example, a layout area of the semiconductor fin 114 (testing feature 116) is in a range of about 10 times to about 10000 times of a layout area of the semiconductor fins 112. It is noted that, in accordance with the practice in the industry, the semiconductor fins 112 and 114 and the testing feature 116 are not drawn to scale. In fact, the dimensions of the semiconductor fins 112 and 114 and the testing feature 116 in the figures may be arbitrarily increased or reduced for clarity of discussion. The semiconductor fins 112 and 114 and the testing feature 116 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 112 and 114 and the testing feature 116 in this case) and developed to remove a portion of the photoresist material. The remaining photoresist material protects the underlying material from subsequent processing operations, such as etching. It should be noted that other masks, such as an oxide or silicon nitride mask, may also be used in the etching process. In some embodiments, the distance D between adjacent semiconductor fins 112 may be about 12 nm to about 50 nm, the width W of the semiconductor fins 112 and 114 may be about 4 nm to about 8 nm, the height H of the semiconductor fins 112 and 114 may be about 30 nm to about 100 nm, and the present disclosure is not limited in this respect.

In some other embodiments, the semiconductor fins 112 and 114 and the testing feature 116 may be epitaxially grown. For example, exposed portions of an underlying material, such as an exposed portion of the substrate 110, may be used in an epitaxial process to form the semiconductor fins 112 and 114 and the testing feature 116. A mask may be used to control the shape of the semiconductor fins 112 and 114 and the testing feature 116 during the epitaxial growth process.

A plurality of isolation features 120, such as shallow trench isolation (STI), are formed in the substrate 110 to separate various devices. The formation of the isolation features 120 may include etching trenches in the substrate 110 and filling the trench by insulator materials such as silicon oxide, silicon nitride, or silicon oxynitride. The filled trench may have a multi-layer structure such as a thermal oxide liner layer with silicon nitride filling the trench. In some embodiments, the isolation features 120 may be created using a process sequence such as: growing a pad oxide, forming a low pressure chemical vapor deposition (LPCVD) nitride layer, patterning an STI opening using photoresist and masking, etching the trenches in the substrate 110 to form the semiconductor fins 112 and 114 and the testing feature 116, optionally growing a thermal oxide trench liner to improve the trench interface, filling the trenches with CVD oxide, using chemical mechanical planarization (CMP) to remove the excessive dielectric layers, and etching back the remained dielectric layers to form the isolation features 120 such that top portions of the semiconductor fins 112 and 114 and the testing feature 116 protrude from the isolation features 120.

Figure 5:
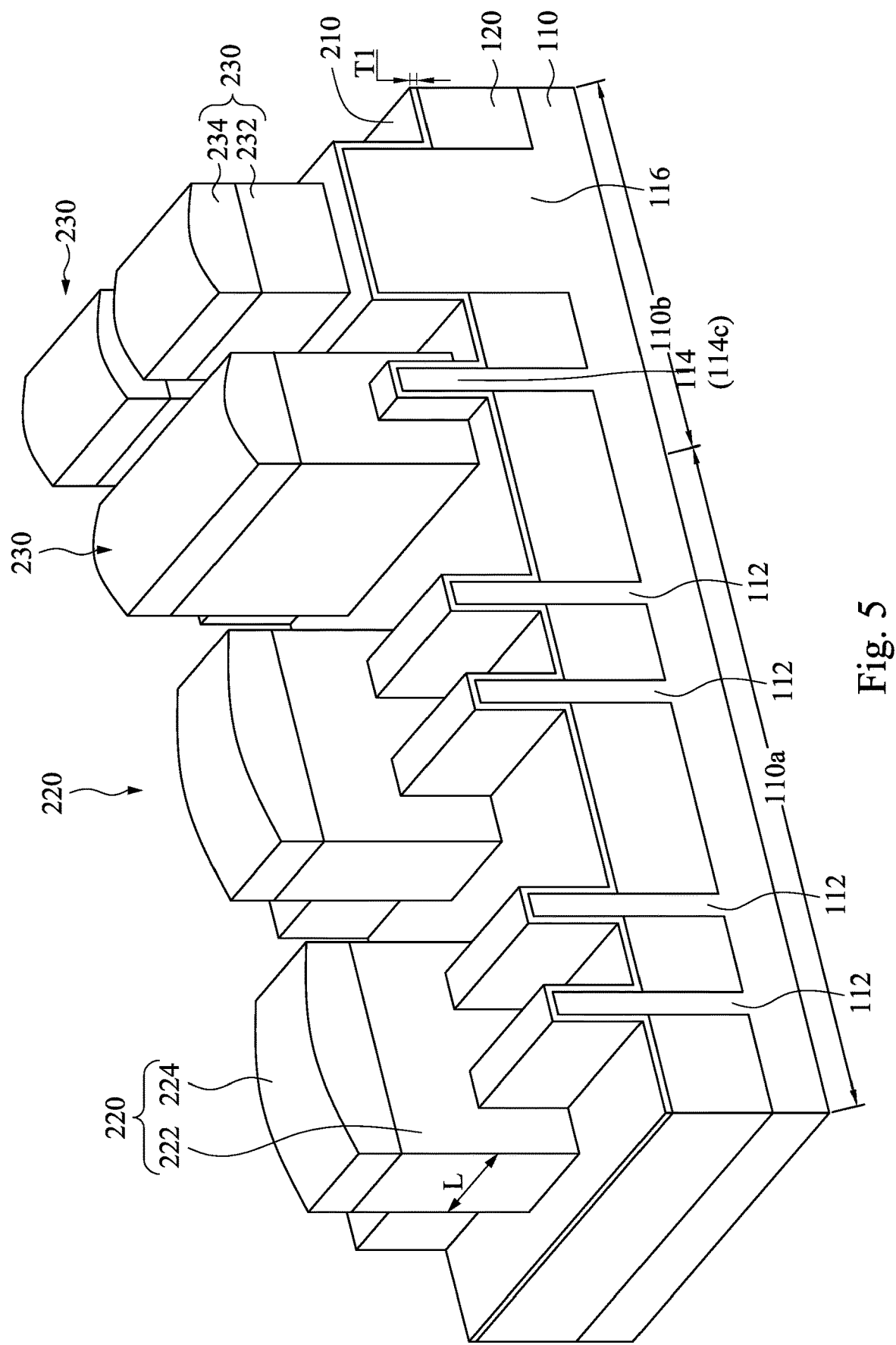

Reference is made to FIG. 5. An interfacial layer 210 is conformally formed to cover the semiconductor fins 112, 114, the testing feature 116, and the isolation features 120. In some embodiments, the interfacial layer 210 may include silicon dioxide, silicon nitride, a high-κ dielectric material or other suitable material. In various examples, the interfacial layer 210 may be deposited by an ALD process, a CVD process, a subatmospheric CVD (SACVD) process, a flowable CVD process, a PVD process, or other suitable process. By way of example, the interfacial layer 210 may be used to prevent damage to the semiconductor fins 112 by subsequent processing (e.g., subsequent formation of the dummy gate structure). In some embodiments, the thickness T1 of the interfacial layer 210 is about 1 nm to about 3 nm.

A plurality of dummy gate structures 220 are formed over the interfacial layer 210 and the semiconductor fins 112. The dummy gate structure 220 includes a dummy gate electrode 222 and a hard mask layer 224 formed over the dummy gate electrode 222. In some embodiments, a dummy gate layer (not shown) may be formed over the interfacial layer 210, and the hard mask layers 224 are formed over the dummy gate layer. The dummy gate layer is then patterned using the hard mask layers 224 as masks to form the dummy gate electrodes 222. As such, the dummy gate electrode 222 and the hard mask layer 224 are referred to as the dummy gate structure 220. In some embodiments, the dummy gate electrodes 222 may be made of polycrystalline-silicon (poly-Si), poly-crystalline silicon-germanium (poly-SiGe), or other suitable materials. The hard mask layers 224 may be made of silicon nitride or other suitable materials. In some embodiments, the length L of the dummy gate structure 220 is about 8 nm to about 20 nm, and the present disclosure is not limited in this respect.

Furthermore, dummy pattern stacks 230 are formed over the interfacial layer 210, the semiconductor fin 114, and the testing feature 116. Specifically, one of the dummy pattern stacks 230 covers the second portion 114b (see FIG. 4) of the semiconductor fin 114 and does not cover the first portion 114a (see FIG. 4) and the third portion 114c of the semiconductor fin 114. The dummy pattern stack 230 includes a dummy pattern 232 and a hard mask layer 234 over the dummy pattern 232. The aforementioned dummy gate layer is further patterned using the hard mask layer 234 as masks to form the dummy patterns 232. It is noted that the number of the dummy pattern stacks 230 in FIG. 5 is illustrative. In some other embodiments, there may be one or more dummy pattern stacks 230 over the testing portion 116. Furthermore, the dummy pattern stacks 230 may have a square cross section (as shown in FIG. 5), a circle cross section, an irregular cross section, or other suitable cross sections. In some embodiments, a layout area of the dummy pattern stack 230 is greater than a layout area of the dummy gate structure 220. For example, the layout area of the dummy pattern stack 230 is in a range of about 10 times to about 10000 times of the layout area of the dummy gate structure 220. It is noted that, in accordance with the practice in the industry, the dummy gate structure 220 and the dummy pattern stack 230 are not drawn to scale. In fact, the dimensions of the dummy gate structure 220 and the dummy pattern stack 230 in the figures may be arbitrarily increased or reduced for clarity of discussion. With such configuration, the dummy pattern stacks 230 provide sufficient area to perform the measurement processes mentioned above (such as the operations S20 and S60 of FIG. 1). On the contrary, the layout areas of the dummy gate structure 220 are too small to perform the measurement processes.

Figure 6A:
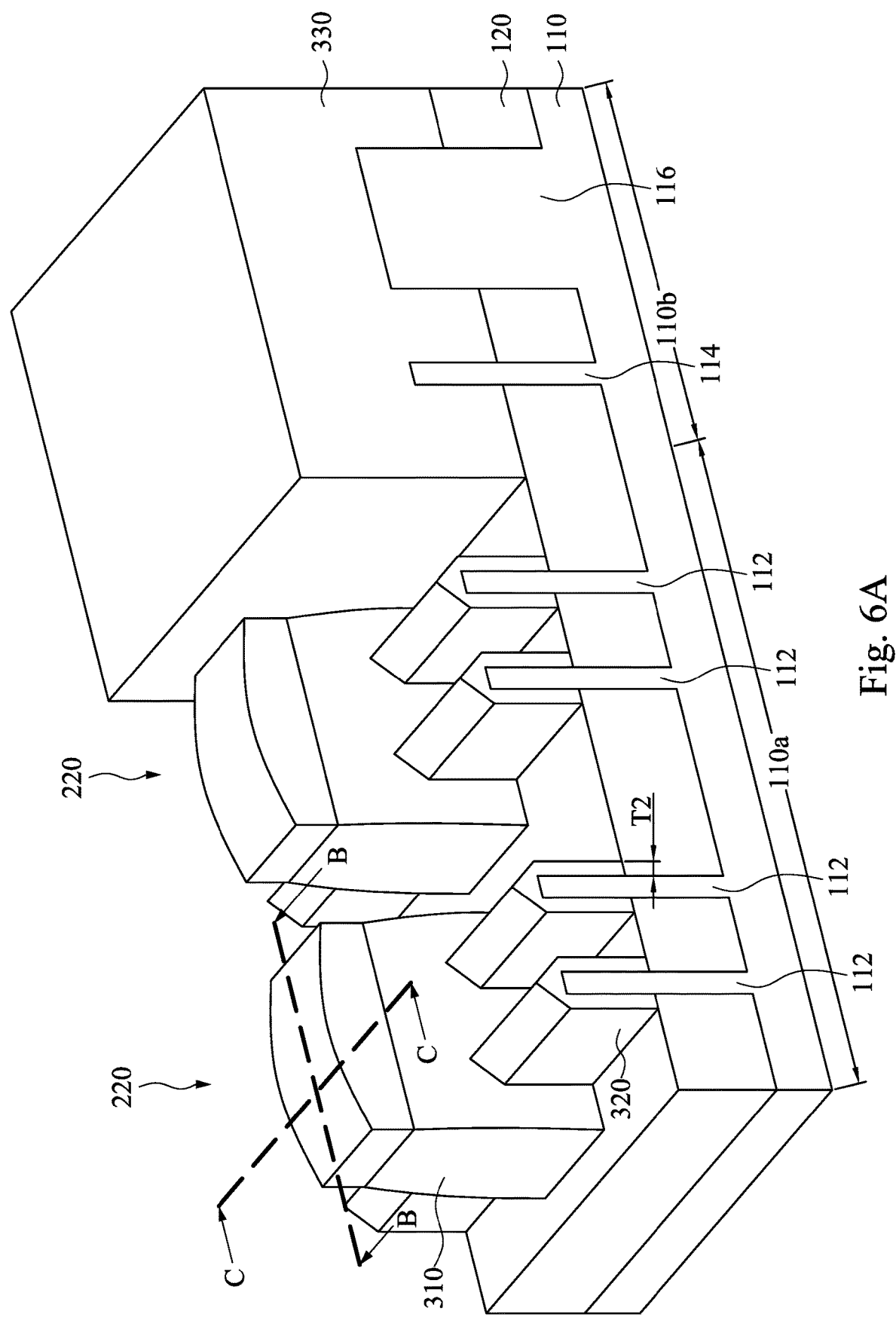
Figure 6B:
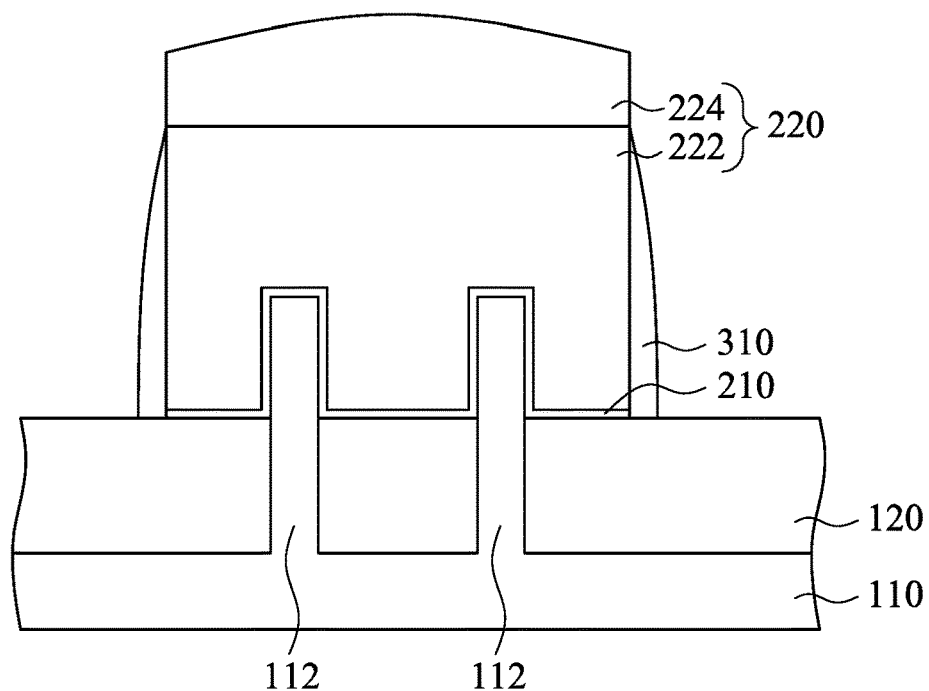
FIG. 6B is a cross-sectional view taking along line B-B of FIG. 6A.
Figure 6C:
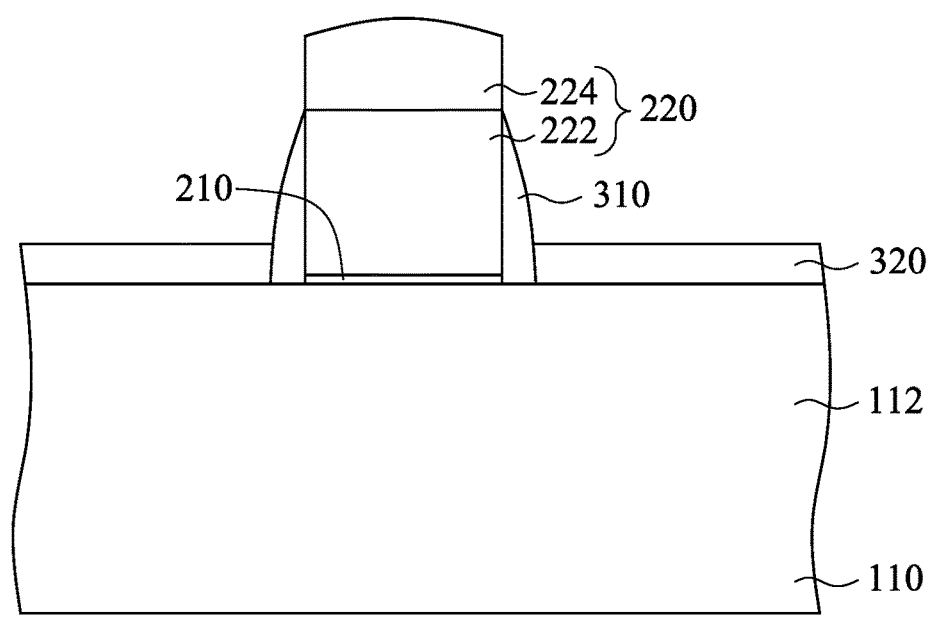
FIG. 6C is a cross-sectional view taking along line C-C of FIG. 6A.

Reference is made to FIGS. 6A to 6C, where FIG. 6B is a cross-sectional view taking along line B-B of FIG. 6A, and FIG. 6C is a cross-sectional view taking along line C-C of FIG. 6A. Portions of the interfacial layer 210 uncovered by the dummy gate structures 220 and the dummy patterns 230 are removed to expose portions of the semiconductor fins 112, 114, and the testing feature 116. Spacer structures 310 are formed on sidewalls of the dummy gate structures 220 and the dummy patterns 230. The spacer structures 310 may include a seal spacer and a main spacer (not shown). The spacer structures 310 include one or more dielectric materials, such as silicon oxide, silicon nitride, silicon oxynitride, SiCN, SiCxOyNz, or combinations thereof. The seal spacers are formed on sidewalls of the dummy gate structures 220 and the dummy pattern 230 and the main spacers are formed on the seal spacers. The spacer structures 310 can be formed using a deposition method, such as plasma enhanced chemical vapor deposition (PECVD), low-pressure chemical vapor deposition (LPCVD), subatmospheric chemical vapor deposition (SACVD), or the like. The formation of the spacer structures 310 may include blanket forming spacer layers, and then performing etching operations to remove the horizontal portions of the spacer layers. The remaining vertical portions of the gate spacer layers form the spacer structures 310.

A mask 330 is formed over the test region 110b of the substrate 110. That is, the mask 330 covers the dummy patterns 230 (see FIG. 5) while leaves the dummy gate structures 220 uncovered. A semiconductor material is deposited on the exposed portions of the semiconductor fins 112 to form epitaxy structures 320 which are referred to as source/drain features. The epitaxy structures 320 may alternatively be referred to as raised source/drain regions. For example, the semiconductor material, such as silicon germanium (SiGe), is epitaxially grown on the exposed portions of the semiconductor fins 112 to form the epitaxy structures 320. In some embodiments, the epitaxy may be a selective epitaxial growth (SEG) process, in which the semiconductor material is grown on the semiconductor fins 112, and not on dielectric materials. In some other embodiments, the epitaxy may include CVD deposition techniques (e.g., vapor-phase epitaxy (VPE) and/or ultra-high vacuum CVD (UHV-CVD)), molecular beam epitaxy, other suitable epitaxy processes, or combinations thereof. The epitaxy process may use gaseous and/or liquid precursors, which may interact with the composition of the substrate 110. The epitaxy structures 320 may have a lattice constant greater than the lattice constant of the substrate 110. The precursor for growing SiGe may include germane ($GeH_4$, which provides germanium), dichlorosilane (DCS, which provides silicon), and the like. Desired p-type or n-type impurities may be, or may not be, doped while the epitaxial growth proceeds. The dopant concentration may be about 5E20 to about 6E21 $cm^{-3}$, and the present disclosure is not limited in this respect. The doping may be achieved by an ion implantation process, plasma immersion ion implantation (PIII) process, gas and/or solid source diffusion process, other suitable process, or combinations thereof. The epitaxy structures 320 may further be exposed to annealing processes, such as a rapid thermal annealing process. After being annealed, SiGe will try to restore its lattice constant, thus introducing compressive stresses to the channel regions of the resulting semiconductor device, which may be a p-type semiconductor device. Throughout the description, the SiGe epitaxy regions are alternatively referred to as SiGe stressors. In alternative embodiments, other semiconductor materials such as silicon carbon (SiC) may be grown to generate tensile stress in the channels of the resulting semiconductor device, which may be an n-type semiconductor device. In some embodiments, the thickness T2 of the epitaxy structures 320 is about 3 nm to about 8 nm. In some embodiments, the epitaxy structures 320 may be made of SiP, SiAs, SiGeP, SiGeAs, GeP, GeAs, or other SiGeSn III-Vs materials if the epitaxy structure 320 is an n-type epitaxy structure. In some embodiments, the epitaxy structures 320 may be made of SiB, SiGa, SiGeB, SiGeGa, GeB, GeGa, or other SiGeSn III-Vs materials if the epitaxy structure 320 is a p-type epitaxy structure.

Figure 7:
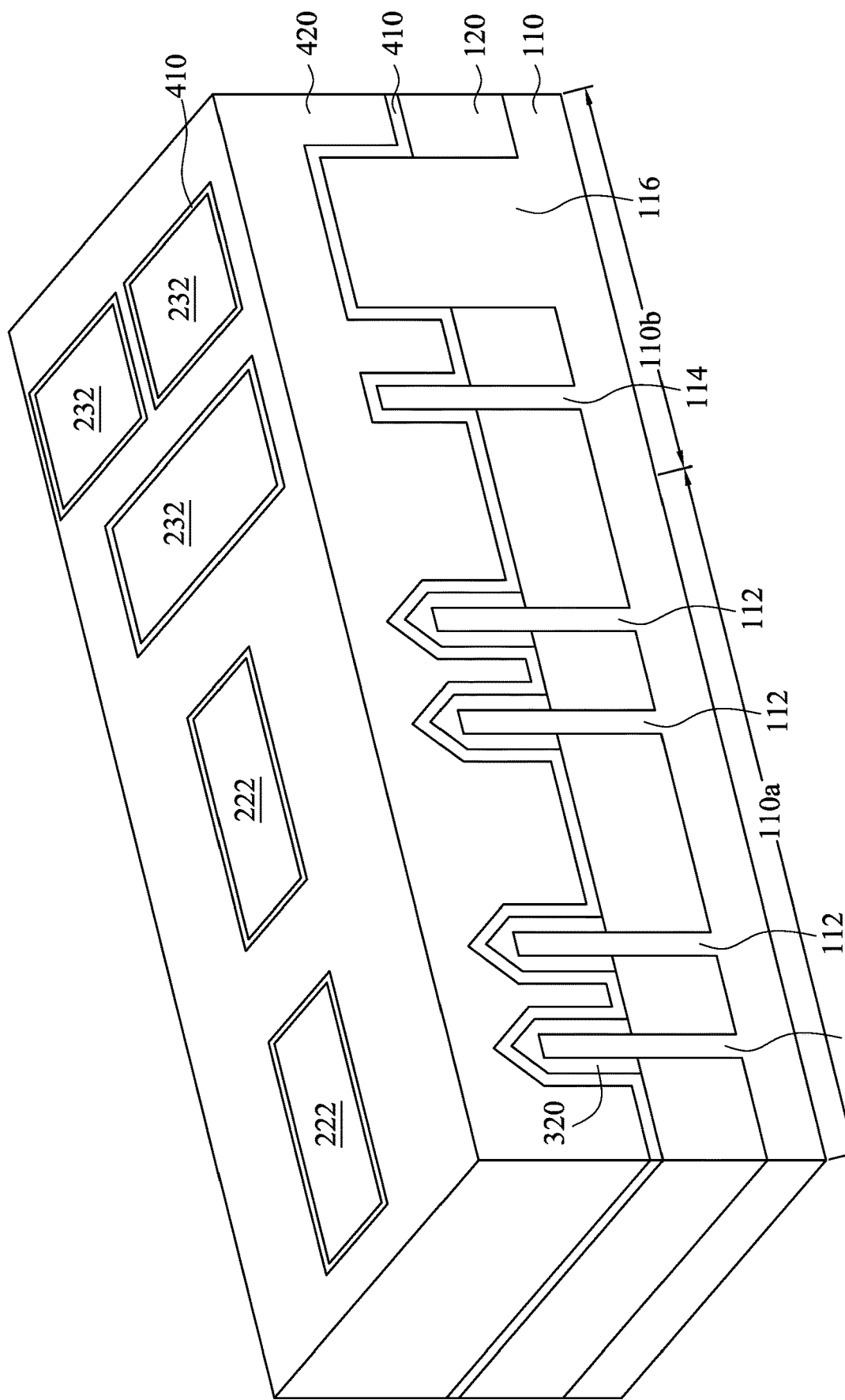

Reference is made to FIG. 7. The mask 330 of FIG. 6A is removed. A contact etch stop layer (CESL) 410 is conformally formed over the structure of FIG. 6A. In some embodiments, the CESL 410 can be a stressed layer or layers. In some embodiments, the CESL 410 has a tensile stress and is formed of $Si_3N_4$. In some other embodiments, the CESL 410 includes materials such as oxynitrides. In yet some other embodiments, the CESL 410 may have a composite structure including a plurality of layers, such as a silicon nitride layer overlying a silicon oxide layer. The CESL 410 can be formed using plasma enhanced CVD (PECVD), however, other commonly used methods such as low pressure CVD (LPCVD), atomic layer deposition (ALD), and the like can also be used.

An interlayer dielectric (ILD) 420 is then formed over the CESL 410. The ILD 420 may be formed by chemical vapor deposition (CVD), high-density plasma CVD, spin-on, sputtering, or other suitable methods. In some embodiments, the ILD 420 includes silicon oxide. In some other embodiments, the ILD 420 may include silicon oxy-nitride, silicon nitride, or a low-k material. An annealing process can be performed to the ILD 420 to cure the ILD 420.

Following a chemical mechanical planarization (CMP) is performed to level the top surfaces of the ILD 420 and the CESL 410 with the top surfaces of the dummy gate electrodes 222 and the dummy patterns 232. As such, the hard mask layers 224 and 234 of FIG. 5 are removed and the dummy gate electrodes 222 and the dummy patterns 232 are exposed from the ILD 420 and the CESL 410. Another annealing process can be performed to the ILD 420 to further cure the ILD 420.

Figure 8A:
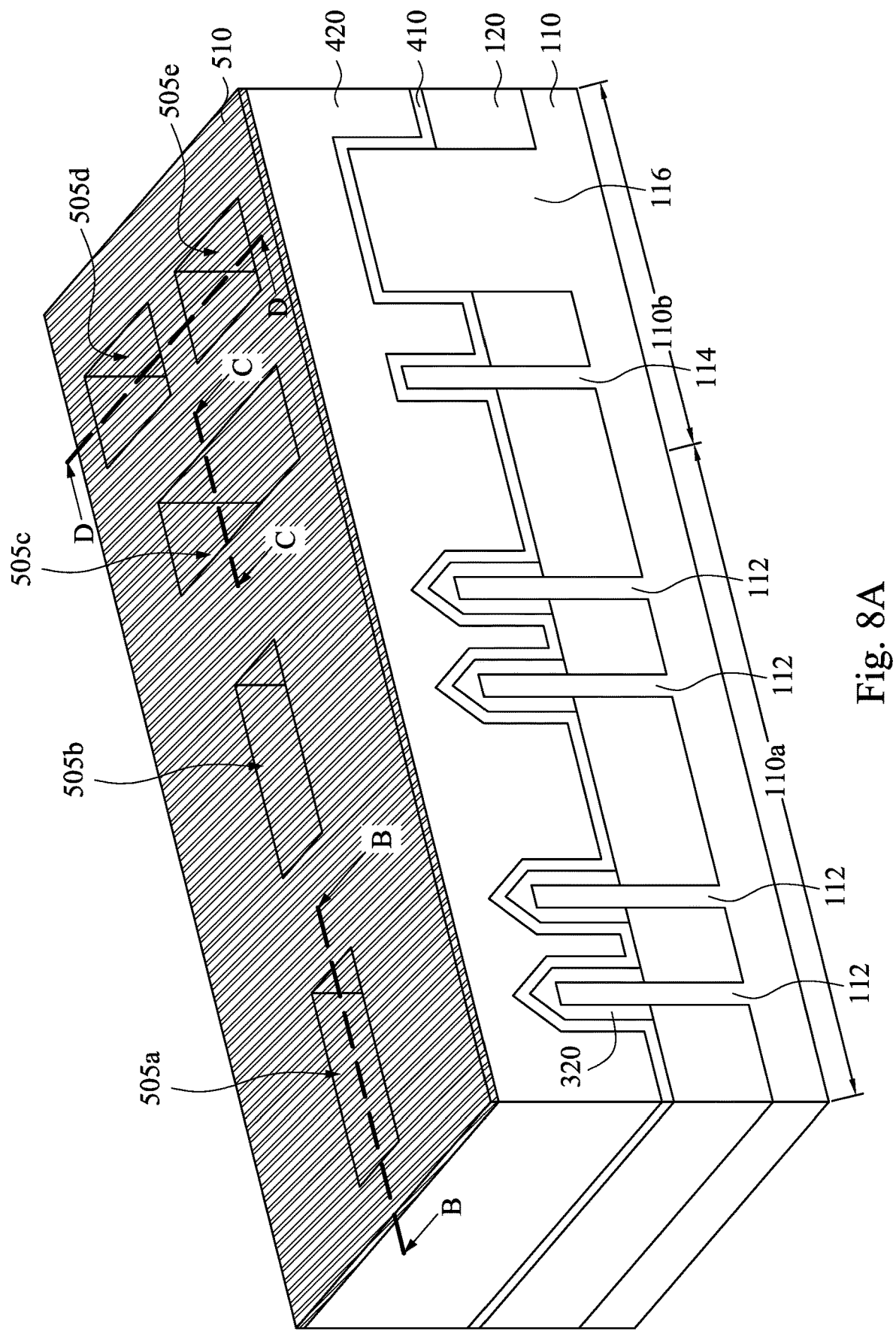
Figure 8B:
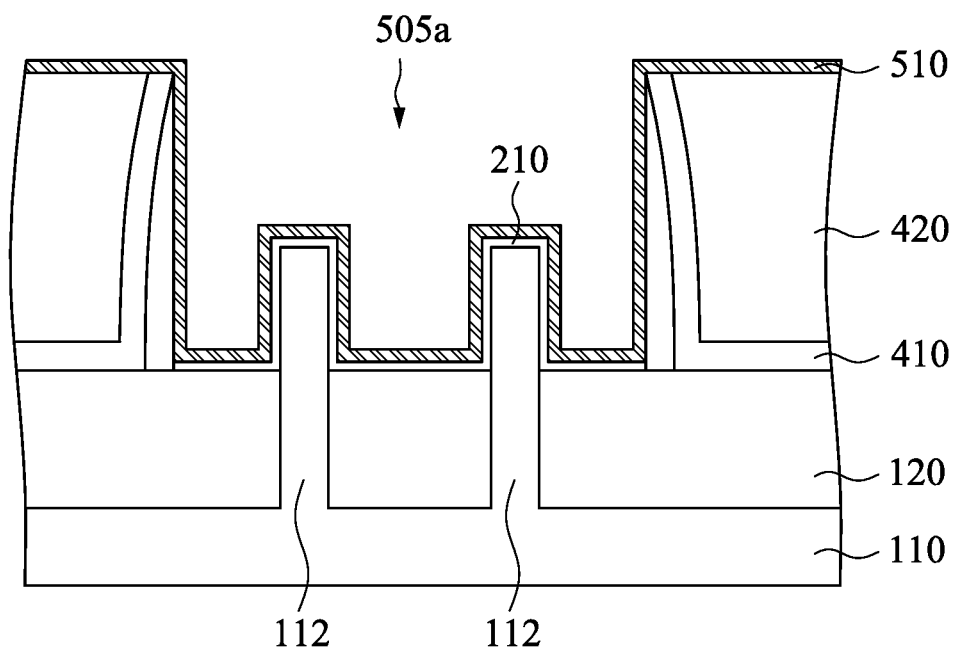
FIG. 8B is a cross-sectional view taking along line B-B of FIG. 8A.
Figure 8C:
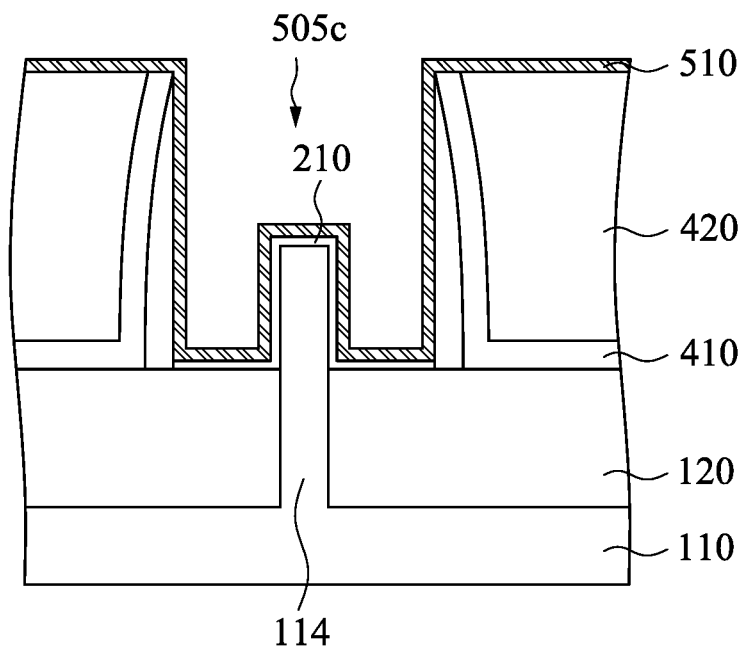
FIG. 8C is a cross-sectional view taking along line C-C of FIG. 8A.
Figure 8D:
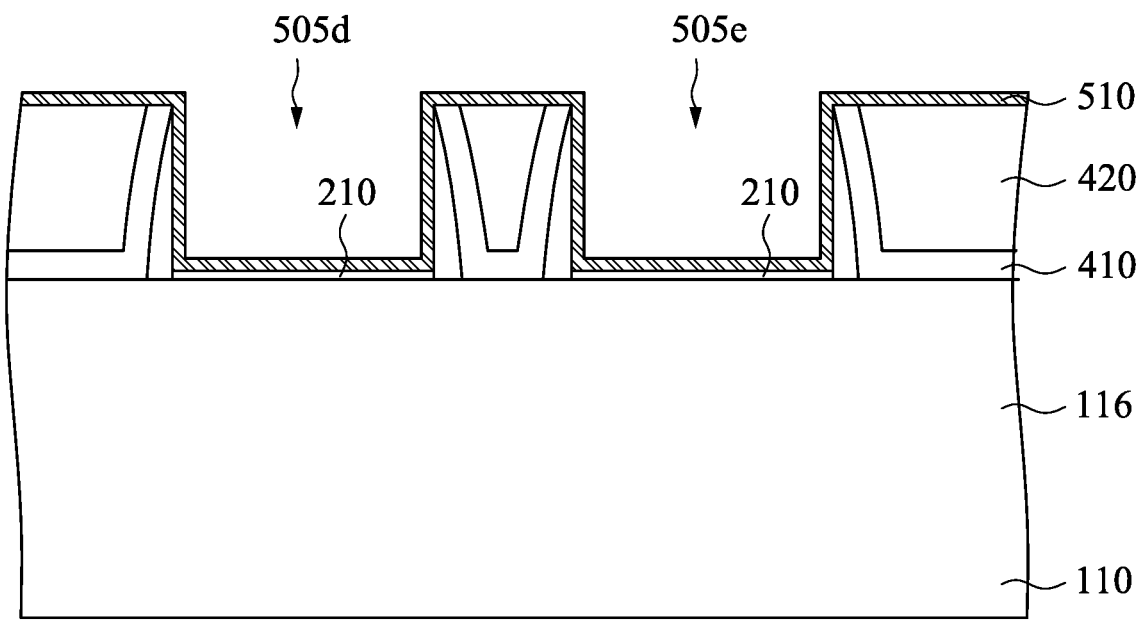
FIG. 8D is a cross-sectional view taking along line D-D of FIG. 8A.

Reference is made to FIGS. 8A to 8D, where FIG. 8B is a cross-sectional view taking along line B-B of FIG. 8A, FIG. 8C is a cross-sectional view taking along line C-C of FIG. 8A, and FIG. 8D is a cross-sectional view taking along line D-D of FIG. 8A. In some embodiments, a replacement gate (RPG) process scheme is employed. In a RPG process scheme, a dummy polysilicon gate (the dummy gate electrodes 222 and the dummy patterns 232 in this case) is formed and is replaced later by a metal gate after high thermal budget processes are performed. In some embodiments, the dummy gate electrodes 222 and the dummy patterns 232 (see FIG. 5) are removed to form openings 505a, 505b, 505c, 505d, and 505e with the spacer structures 310 as their sidewalls. That is, the spacer structures 310 define the openings 505a, 505b, 505c, 505d, and 505e. In some other embodiments, the interfacial layers 210 (see FIGS. 6B and 6C) are removed as well. Alternatively, in some embodiments, the dummy gate electrodes 222 and the dummy patterns 232 are removed while the interfacial layers 210 retains. The dummy gate electrodes 222 and the dummy patterns 232 (and the interfacial layers 210) may be removed by dry etch, wet etch, or a combination of dry and wet etch. For example, a wet etch process may include exposure to a hydroxide containing solution (e.g., ammonium hydroxide), deionized water, and/or other suitable etchant solutions.

A dielectric layer 510 is conformally formed in the openings 505a-505e and over the ILD 420. In some embodiments, the dielectric layer 510 may be a high dielectric constant (high-κ) dielectric layer having a dielectric constant (κ) higher than the dielectric constant of $SiO_2$, i.e. κ>3.9. During the formation of the dielectric layer 510, an in-situ doping process is performed to dope the dielectric layer 510. In some embodiments, the dopants used in this process may include Si and/or metal elements (such as Zr, Al, La, Y, Gd, Sr), and/or other suitable materials. As such, the dielectric layer 510 may include doped $HfO_2$, lead zirconate titanate (PZT), LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, or other suitable materials. The dielectric layer 510 is deposited by suitable techniques, such as thermal-ALD, PEALD, CVD, PVD, thermal oxidation, combinations thereof, or other suitable techniques. In some embodiments, the dielectric layer 510 is formed using $HfCl_4$, TDMA-Hf, or TEMA-HF as a precursor and using $O_3$, $H_2O$, or $O_2$ as oxidant. The forming process is performed at about 100° C. to about 500° C., about 0.1 torr to about 300 torr. The pulse time is about 0.01 s to about 200 s, and the purge time is about 0.01 s to about 500 s.

Figure 9A:
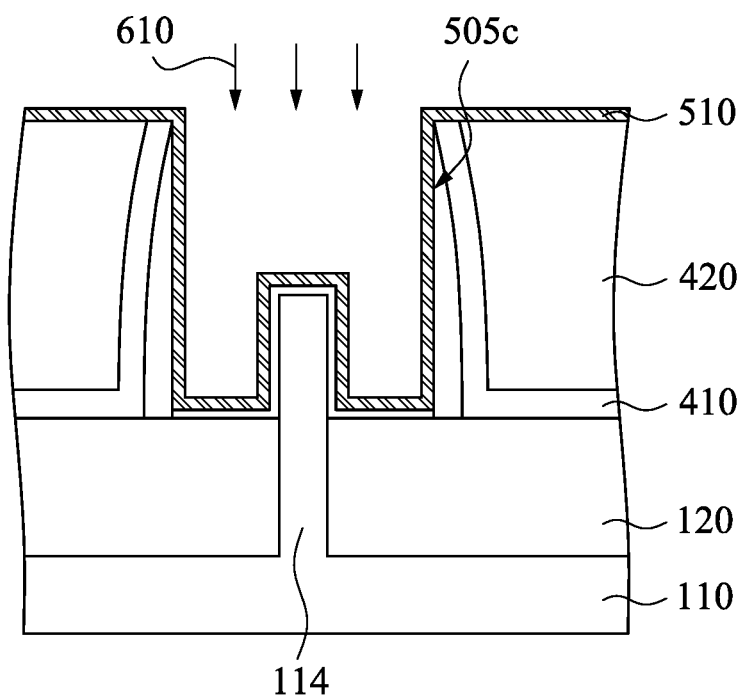
FIGS. 9A and 9B are cross-sectional views of a semiconductor device in accordance with some embodiments of the present disclosure.
Figure 9B:
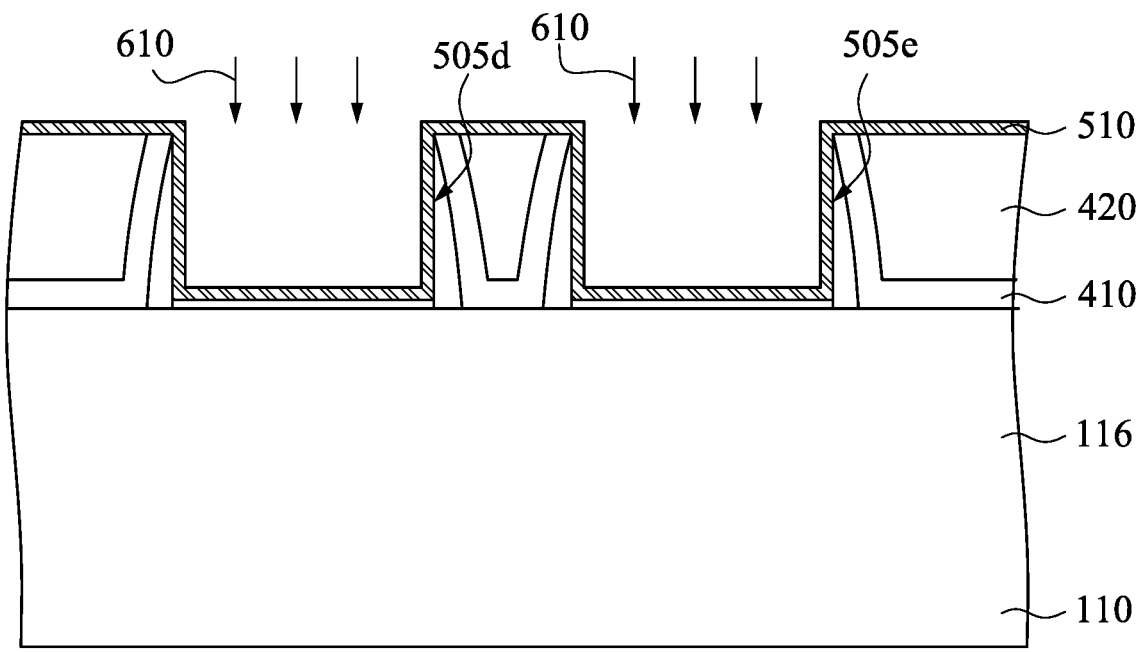

Reference is made to FIGS. 9A and 9B, where cross-sectional positions of FIGS. 9A and 9B are the same as the cross-sectional positions of FIGS. 8C and 8D. The dielectric layer 510 is expected to be paraelectric and have an amorphous crystal structure in this stage. As such, at least one pre-test process 610 is performed to test the (physical) properties of the dielectric layer 510.

In some embodiments, a variety of pre-test processes 610 are performed. For example, the PFM measurement, the XRD measurement, and the ellipsometry measurement are performed. As such, the ferroelectricity, the crystalline structure, and the thickness of the dielectric layer 510 can be obtained. In this stage, the dielectric layer 510 is expected to be paraelectric (as shown in FIG. 2A) and have an amorphous crystal structure (as shown in FIG. 2B) and a certain thickness. In some embodiments, the dielectric layer 510 has a thickness in a range of about 0.1 nm to about 50 nm. If the dielectric layer 510 is not paraelectric and/or have other kind of crystal structure, the dielectric layer 510 can be considered failed in some embodiments.

Figure 10:
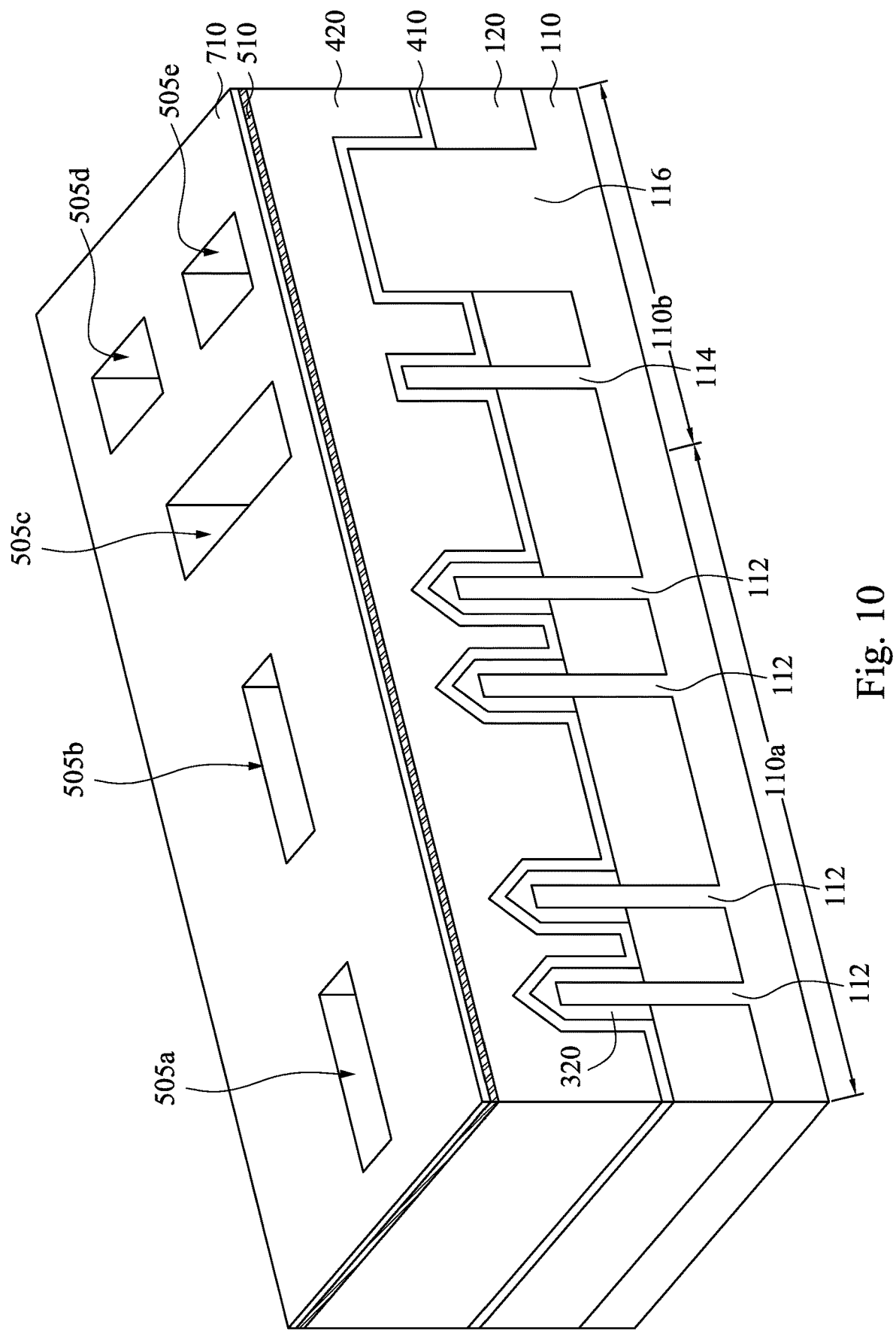

Reference is made to FIG. 10. A cap layer 710 is conformally formed over the dielectric layer 510. The cap layer 710 may include metals and their nitrides (e.g. TiN, TaN, $W_2N$, TiSiN, TaSiN) or other materials such as Pt, Au, W, or combinations thereof. The cap layer 710 may be deposited by PVD, CVD, Metal-organic chemical vapor deposition (MOCVD) and ALD.

Figure 11A:
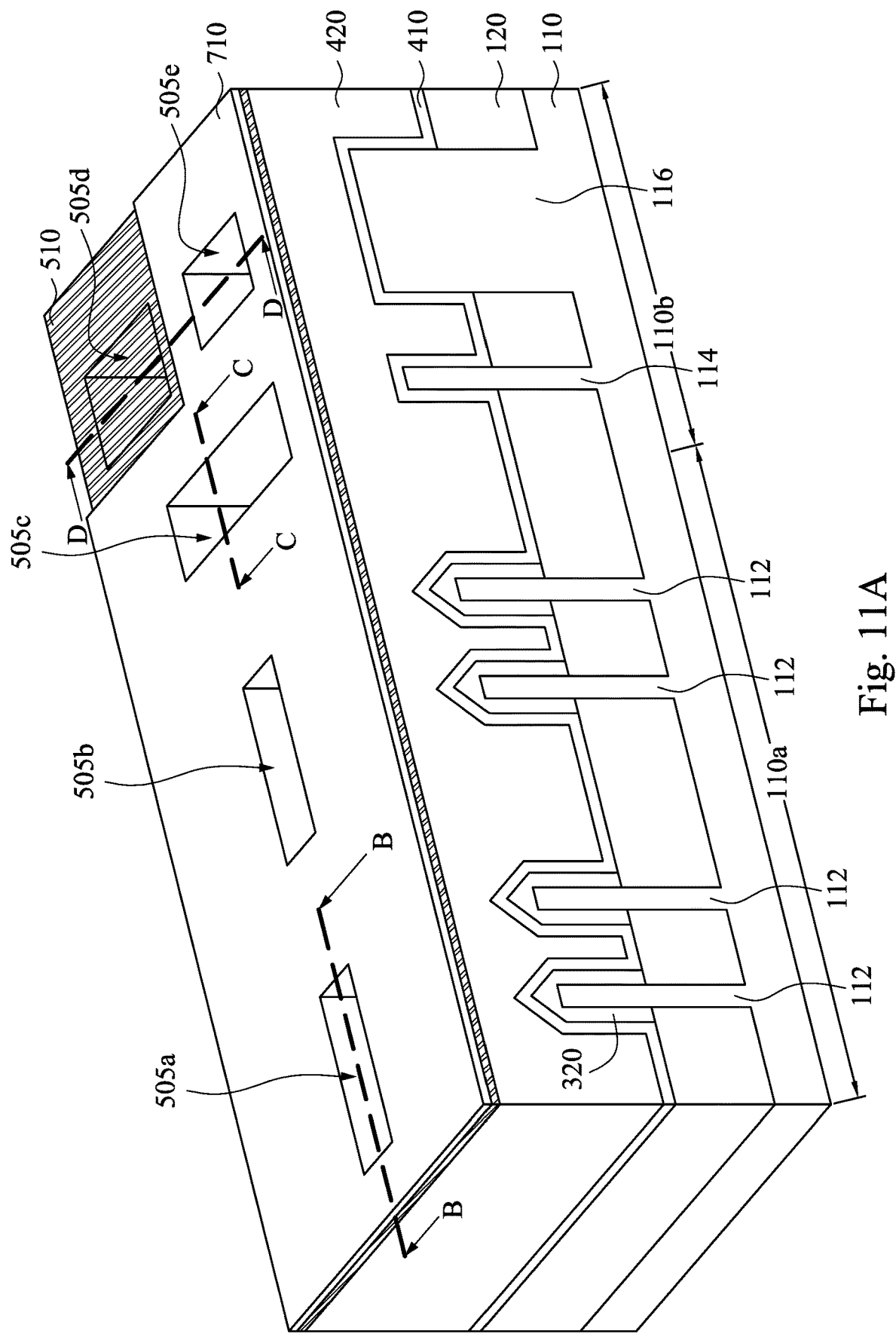
Figure 11B:
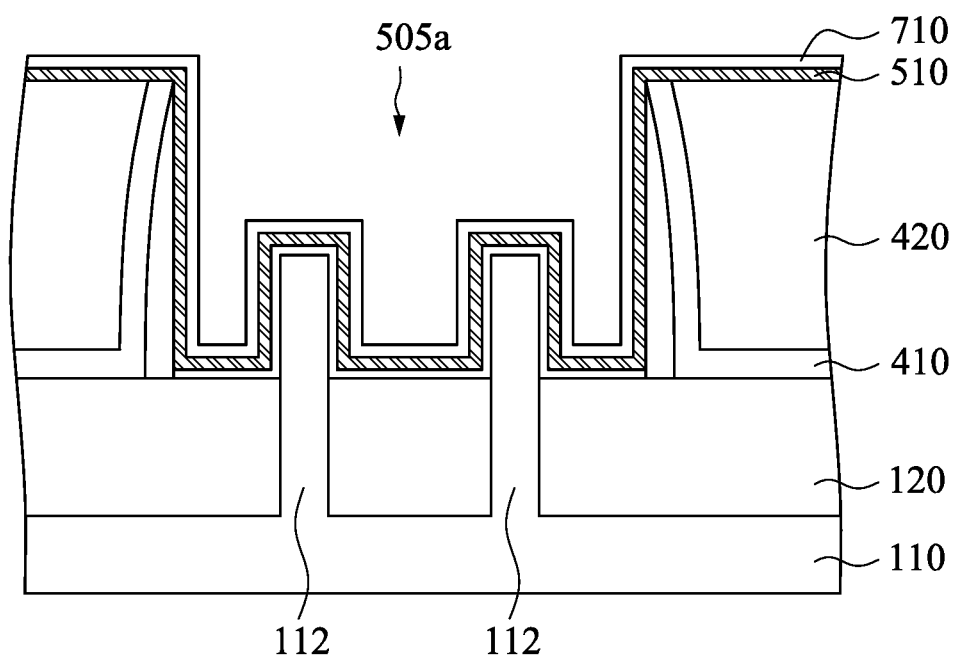
FIG. 11B is a cross-sectional view taking along line B-B of FIG. 11A.
Figure 11C:
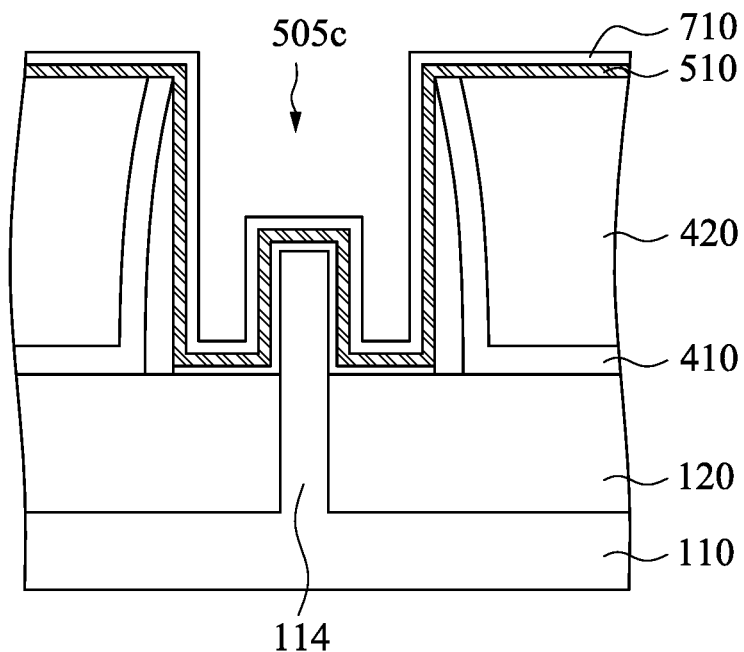
FIG. 11C is a cross-sectional view taking along line C-C of FIG. 11A.
Figure 11D:
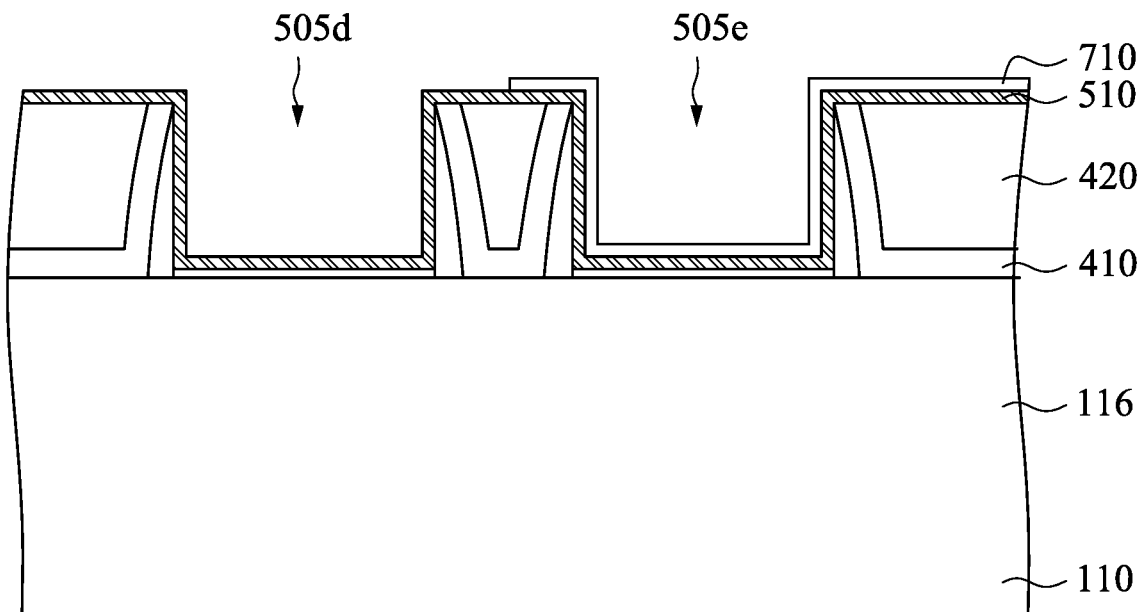
FIG. 11D is a cross-sectional view taking along line D-D of FIG. 11A.

Reference is made to FIGS. 11A to 11D, where FIG. 11B is a cross-sectional view taking along line B-B of FIG. 11A, FIG. 11C is a cross-sectional view taking along line C-C of FIG. 11A, and FIG. 11D is a cross-sectional view taking along line D-D of FIG. 11A. A patterning process is performed to the cap layer 710. In some embodiments, at least a portion of the cap layer 710 in the opening 505d is removed. As such, the remained cap layer 710 is formed in the openings 505a, 505b, 505c, and 505e and not in the opening 505d, and the dielectric layer 510 in the opening 505d is exposed. The cap layer 710 can be patterned by performing an etching process.

An anneal process is performed on the cap layer 710 and the dielectric layer 510. When the amorphous dielectric layer 510 is annealed, it crystallizes to form the high temperature tetragonal modification. During the cooling process of the anneal process, the cap layer 710 provides mechanical stress from the high temperature tetragonal phase of the dielectric layer 510 to the high pressure ferroelectric orthorhombic phase. As such, the annealed dielectric layer 510' is ferroelectric and has an orthorhombic phase. In some embodiments, the anneal process can be a spike annealing process, soak annealing process, or other suitable annealing process. The anneal process may be performed at a temperature in a range of about 400° C. to about 1000° C.

The ferroelectricity of the annealed dielectric layer 510' provides a negative capacitance. The use of ferroelectric materials with negative capacitance allows formation of the semiconductor device having lower subthreshold swing (SS) compared to the semiconductor device without the ferroelectric materials. The SS represents the easiness of switching the transistor current off and on, and is a factor in determining the switching speed of a semiconductor device. Therefore, low SS allows for semiconductor device having higher switching speed compared to the semiconductor device without the ferroelectric materials.

Figure 12A:
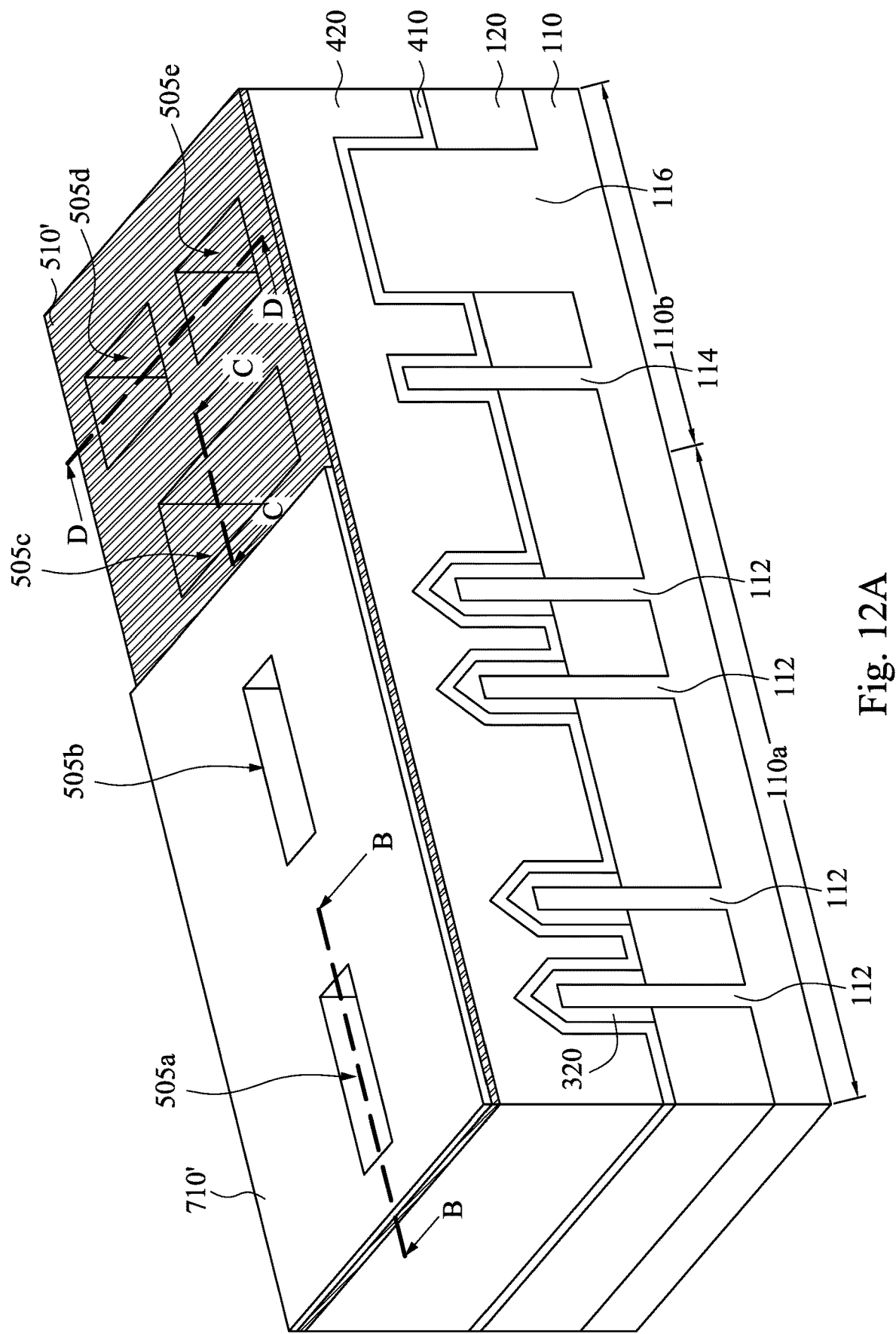
Figure 12B:
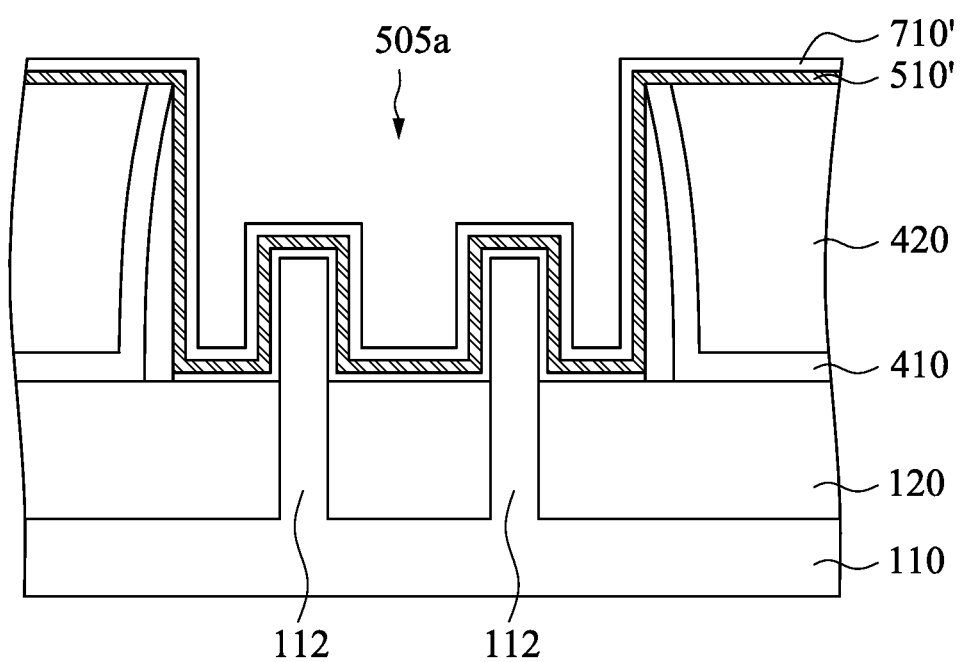
FIG. 12B is a cross-sectional view taking along line B-B of FIG. 12A.
Figure 12C:
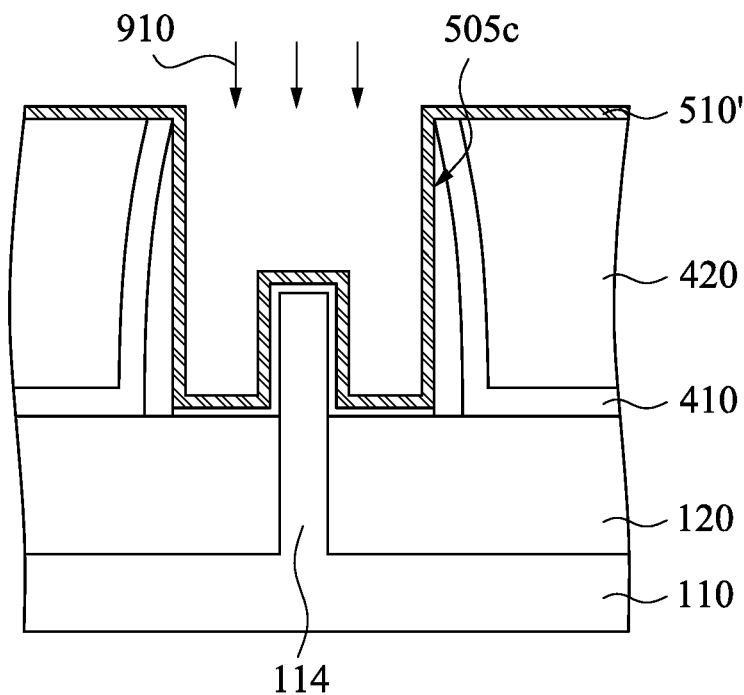
FIG. 12C is a cross-sectional view taking along line C-C of FIG. 12A.
Figure 12D:
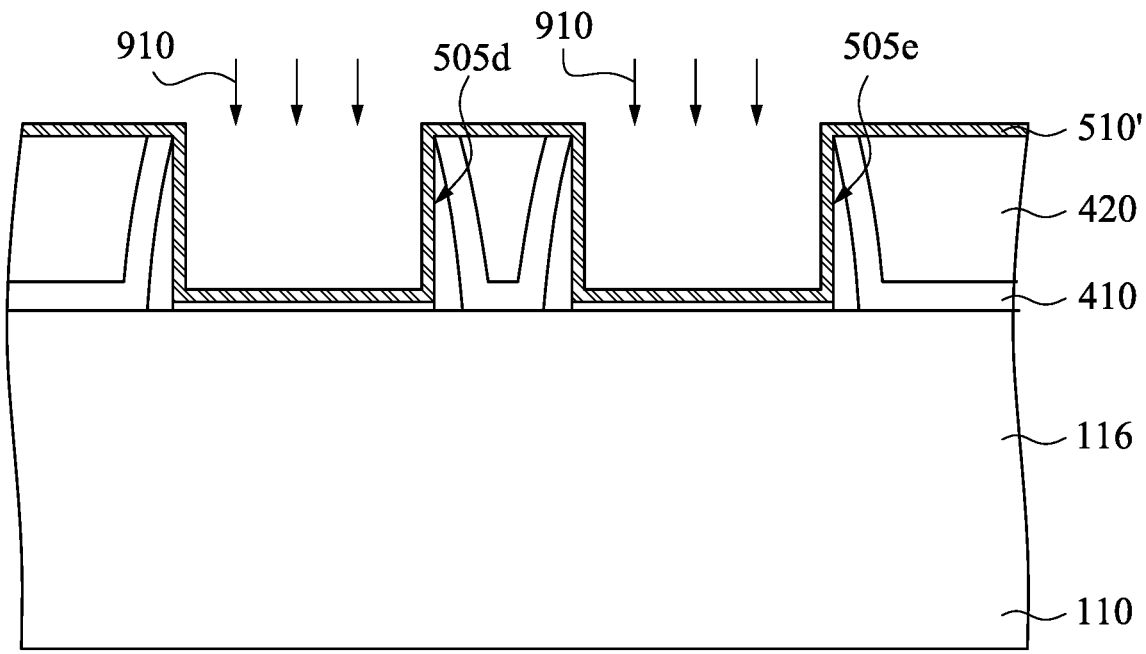
FIG. 12D is a cross-sectional view taking along line D-D of FIG. 12A.

Reference is made to FIGS. 12A to 12D, where FIG. 12B is a cross-sectional view taking along line B-B of FIG. 12A, FIG. 12C is a cross-sectional view taking along line C-C of FIG. 12A, and FIG. 12D is a cross-sectional view taking along line D-D of FIG. 12A. The annealed cap layer 710' in the openings 505c and 505e are removed, such that the annealed dielectric layer 510' in the openings 505c and 505e are exposed. The portion of the annealed dielectric layer 510' in the opening 505c can be referred to as a 3D test structure (such as fin-like), while the annealed dielectric layer 510' in the openings 505d and 505e can be referred to as 2D test structures (such as planer structures). On the other hand, the remained portion of the annealed cap layer 710' in the openings 505a and 505b can be referred to as a barrier layer 710'.

A post-test process 910 is performed on the annealed dielectric layer 510' in the openings 505c-505e. The post-test process 910 can be a PFM measurement process, a XRD measurement process, or an ellipsometry measurement process. In some embodiments, a variety of post-test processes 910 are performed. For example, the PFM measurement, the XRD measurement, and the ellipsometry measurement are performed. As such, the ferroelectricity, the crystalline structure, and the thickness of the dielectric layer 510' can be obtained. In this stage, the dielectric layer 510' in the openings 505c and 505e (as such the dielectric layer 510' in the openings 505a and 505b) are expected to be ferroelectric (as shown in FIG. 3A) and have an orthorhombic crystal structure (as shown in FIG. 3B), and the thickness of the dielectric layer 510' is expected to be the thickness of the dielectric layer 510 (see FIGS. 9A and 9B). On the other hand, since the dielectric layer 510 (see FIG. 11D) in the opening 505d is exposed during the annealing process, the dielectric layer 510' in the opening 505d may be not ferroelectric and have other kind of crystalline structure. That is, the dielectric layer 510' in the opening 505d can be a reference with respect to the dielectric layer 510' in the openings 505a, 505b, 505c, and 505e.

Figure 13A:
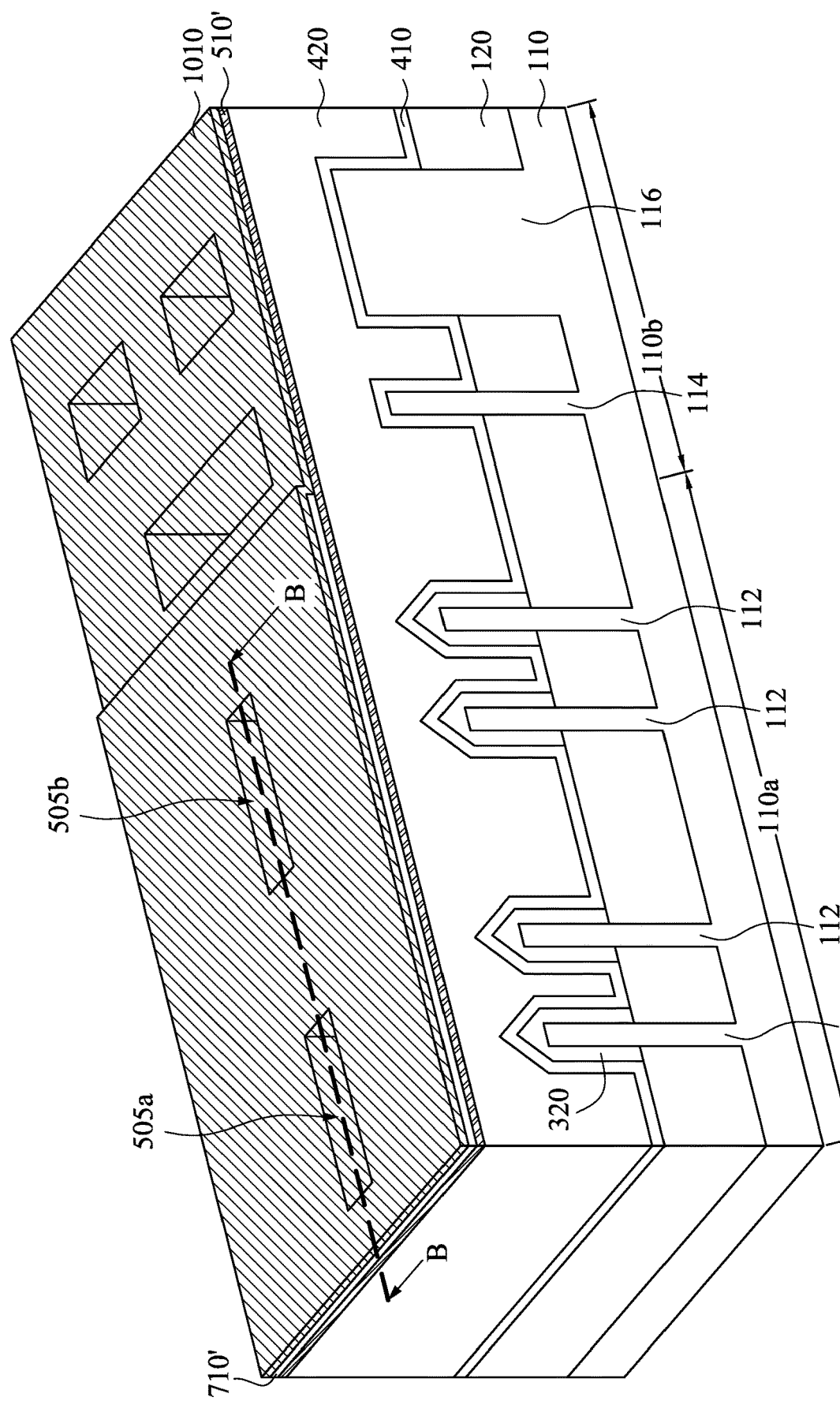
Figure 13B:
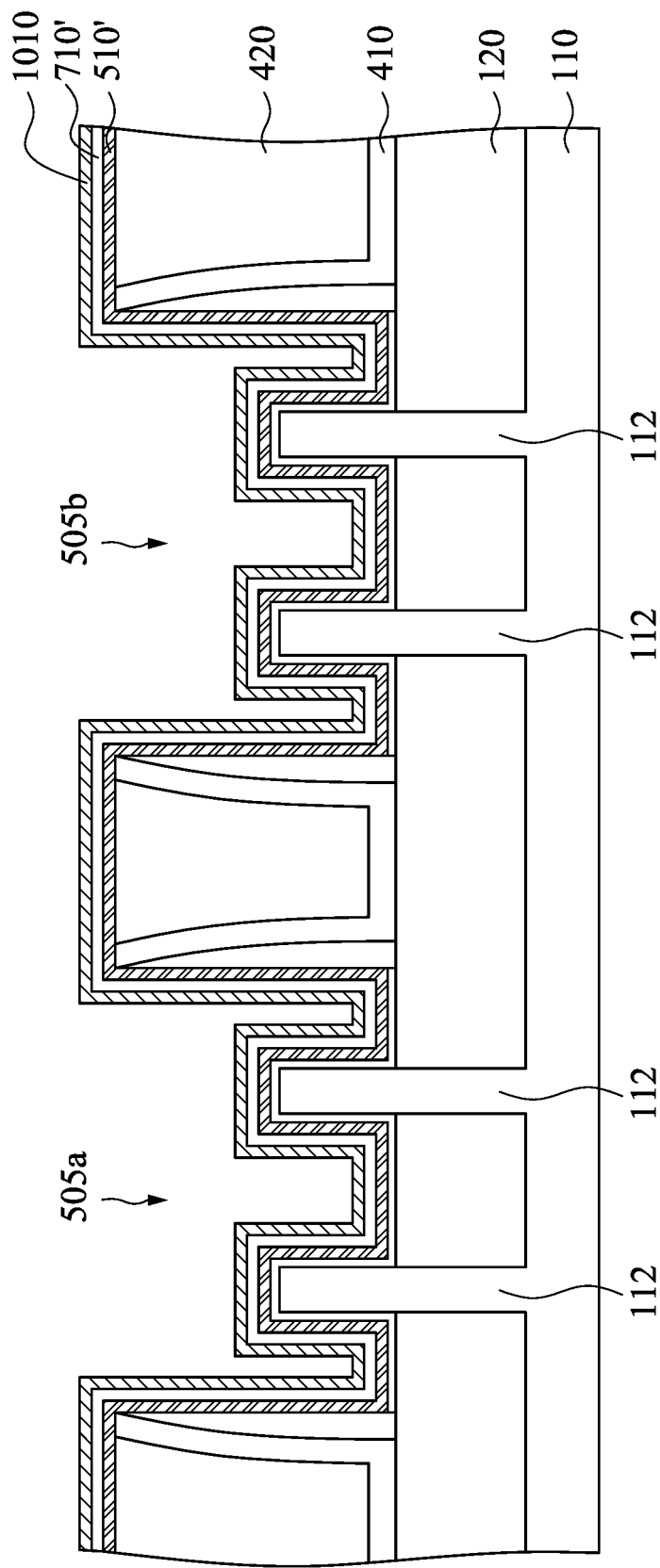
FIG. 13B is a cross-sectional view taking along line B-B of FIG. 13A.

Reference is made to FIGS. 13A and 13B, where FIG. 13B is a cross-sectional view taking along line B-B of FIG. 13A. A work function metal layer 1010 is conformally formed on the barrier layer 710' and the dielectric layer 510'. In some embodiments, the work function metal layer 1010 may include a single layer or multi layers, such as a work function film, a liner film, a wetting film, and an adhesion film. The work function metal layer 1010 may include Ti, TiAl, TiAlN, TaC, TaCN, TaSiN, Mn, Zr, TiN, TaN, Ru, Mo, WN, Co, Al, or any suitable materials. The work function metal layer 1010 may be formed by ALD, PVD, CVD, or other suitable process.

Figure 14A:
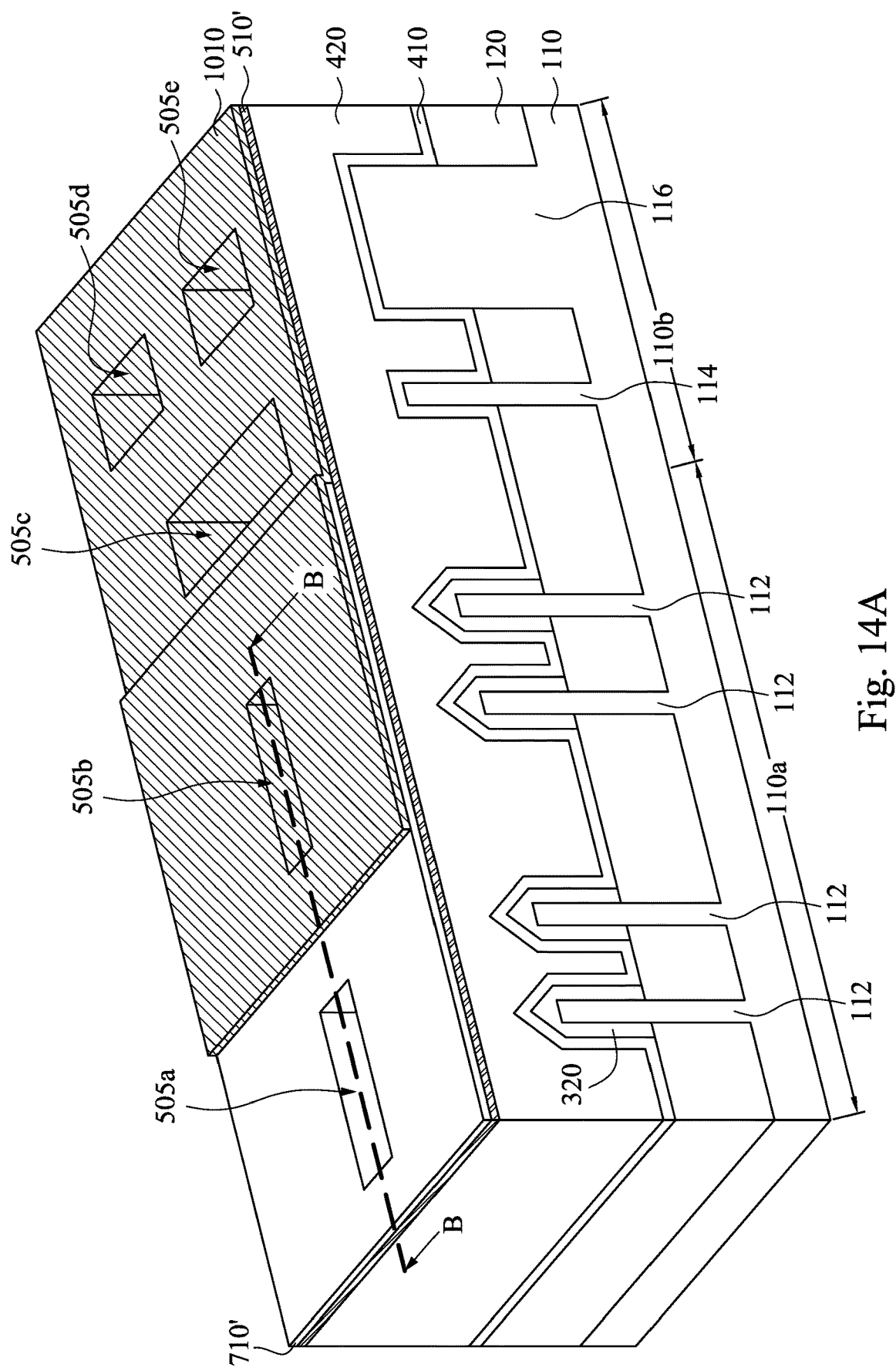
Figure 14B:
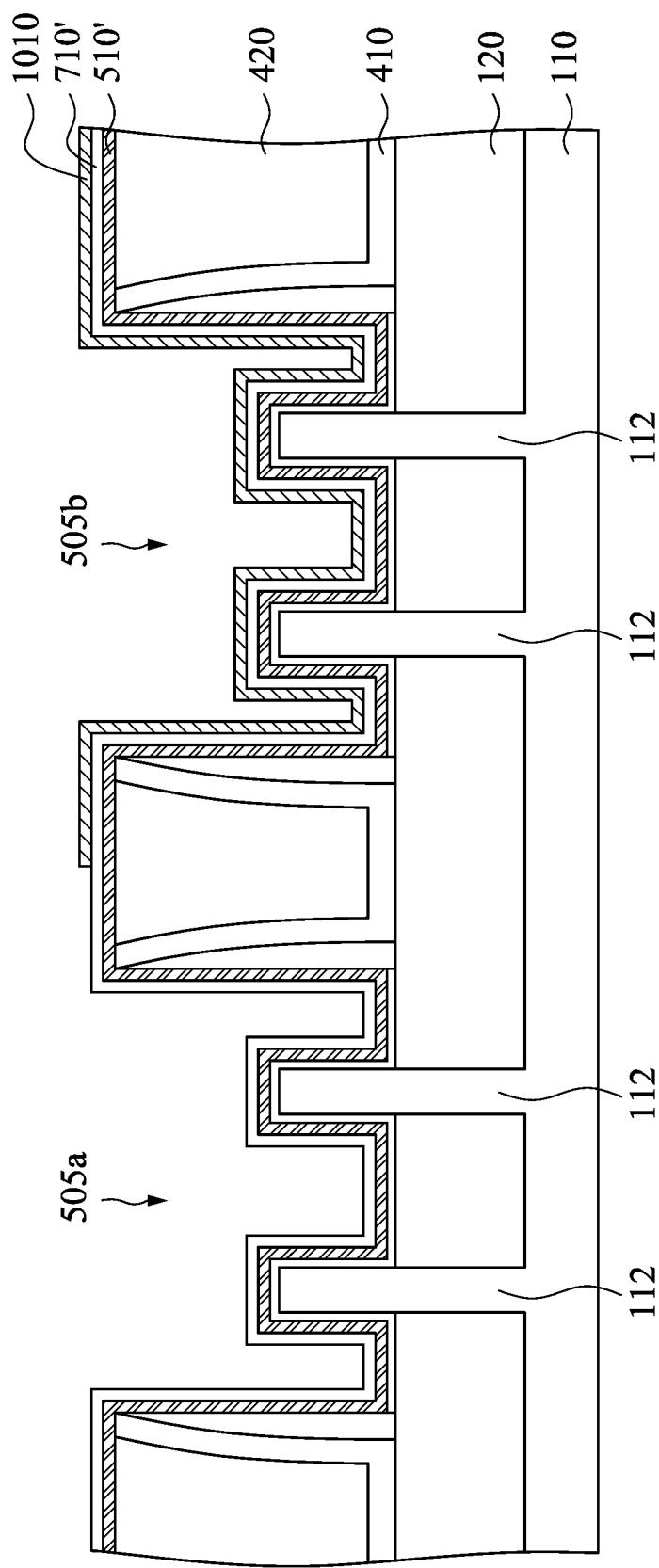
FIG. 14B is a cross-sectional view taking along line B-B of FIG. 14A.

Reference is made to FIGS. 14A and 14B, where FIG. 14B is a cross-sectional view taking along line B-B of FIG. 14A. A patterning process is performed to the work function metal layer 1010. That is, the work function metal layer 1010 is partially removed. In some embodiments, at least a portion of the work function metal layer 1010 in the opening 505a is removed. As such, the work function metal layer 1010 is formed in the openings 505b (505c, 505d, and 505e) and not in the 505a. The work function metal layer 1010 can be patterned by performing an etching process.

Figure 15A:
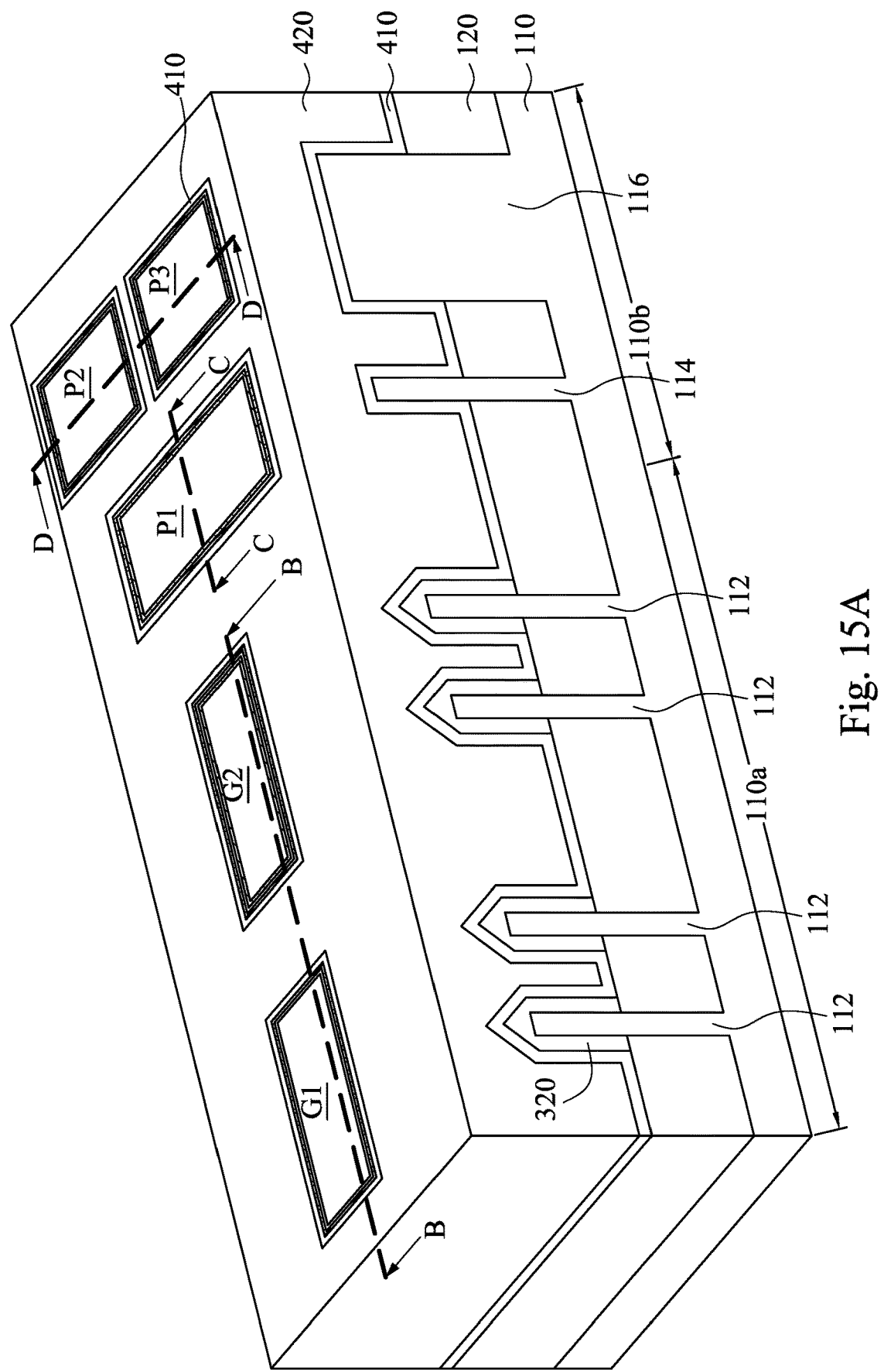
Figure 15B:
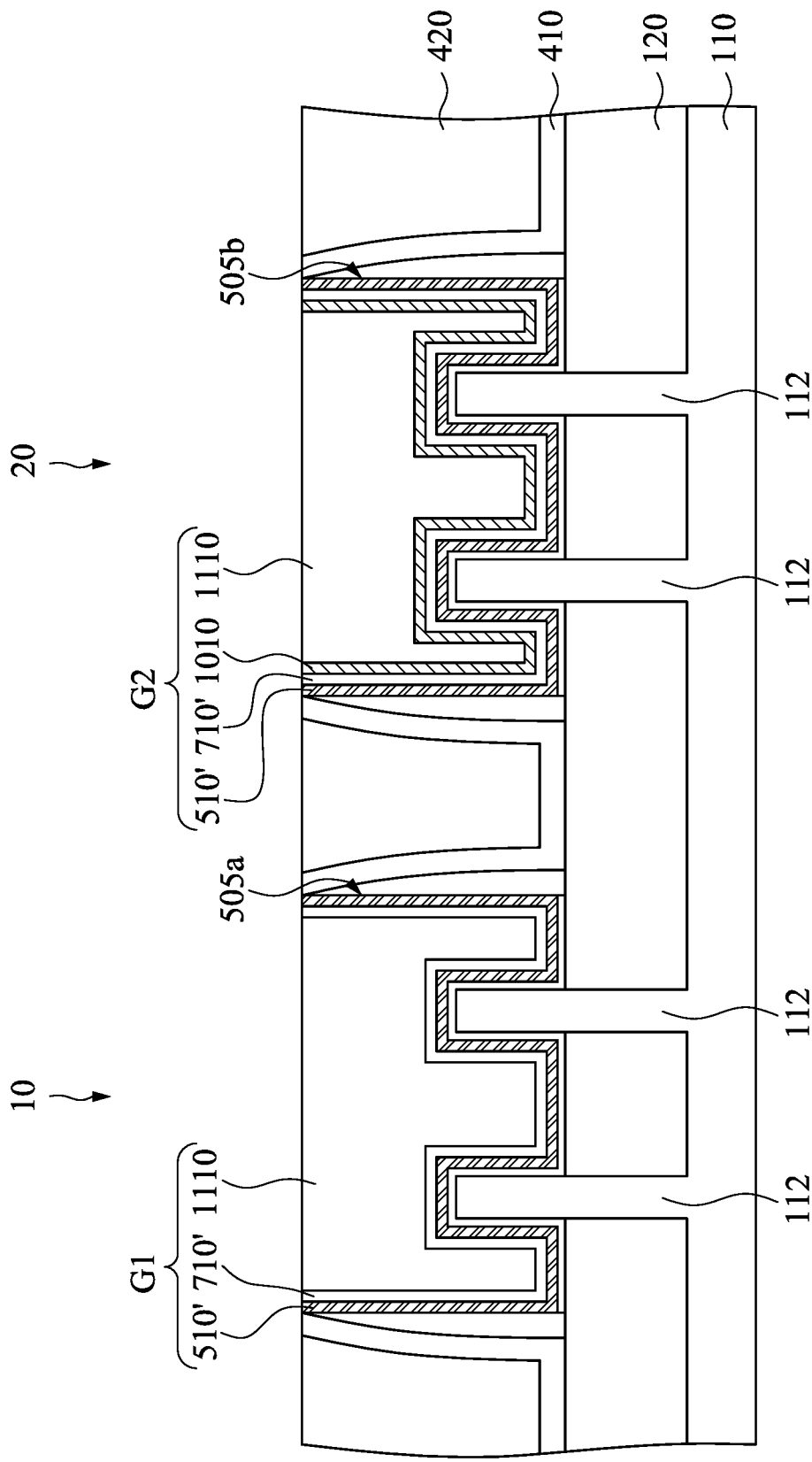
FIG. 15B is a cross-sectional view taking along line B-B of FIG. 15A.
Figure 15C:
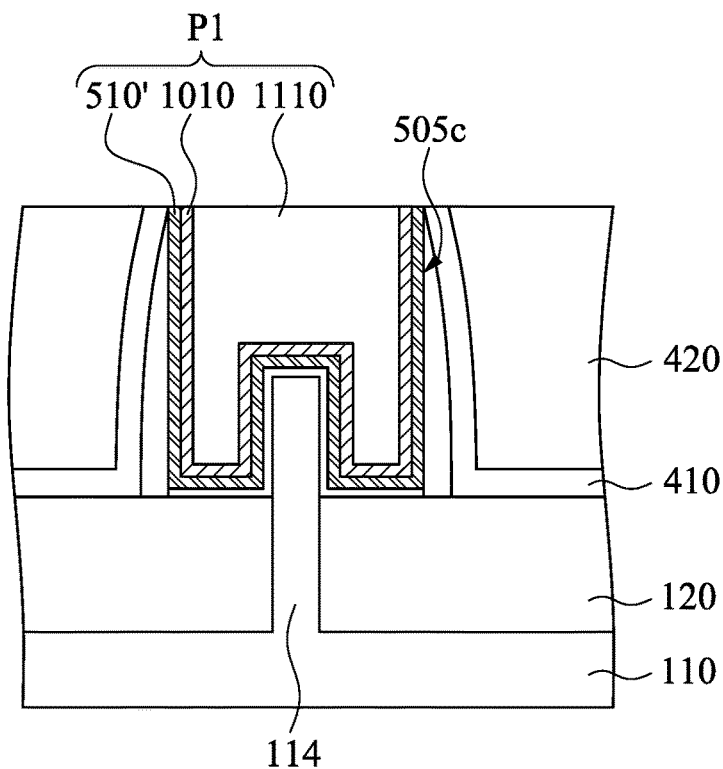
FIG. 15C is a cross-sectional view taking along line C-C of FIG. 15A.
Figure 15D:
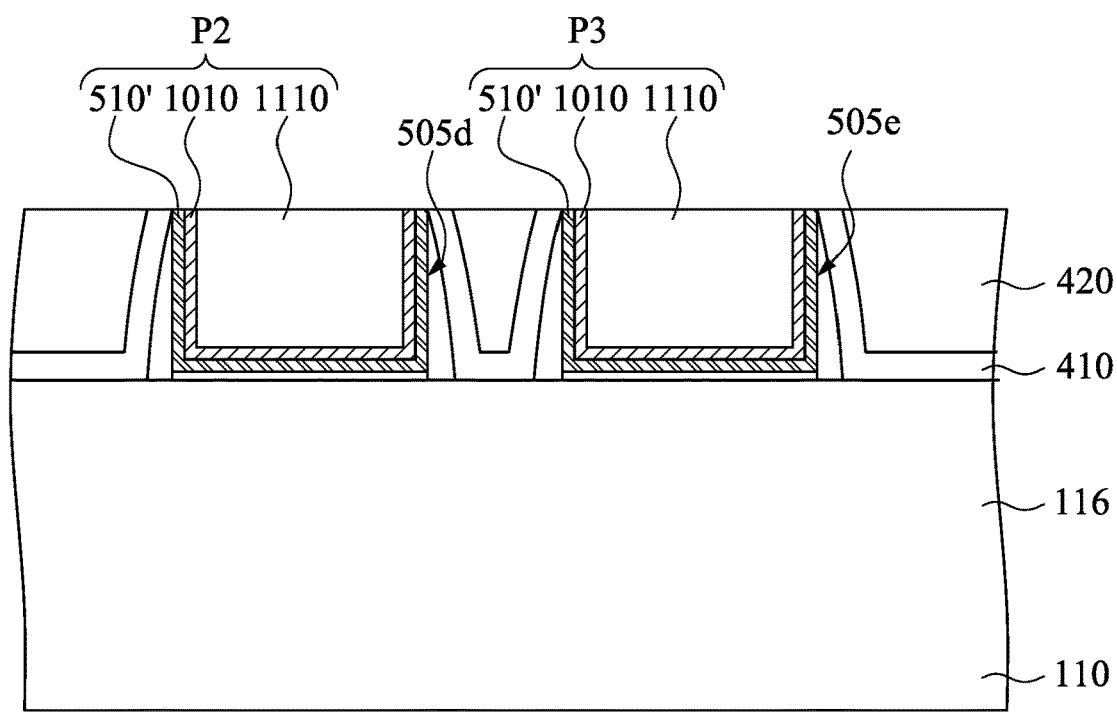
FIG. 15D is a cross-sectional view taking along line D-D of FIG. 15A.

Reference is made to FIGS. 15A to 15D, where FIG. 15B is a cross-sectional view taking along line B-B of FIG. 15A, FIG. 15C is a cross-sectional view taking along line C-C of FIG. 15A, and FIG. 15D is a cross-sectional view taking along line D-D of FIG. 15A. The remaining openings 505a-505e are filled with a metal material 1110 on the work function metal layer 1010 and/or the barrier layer 710'. In some embodiments, the metal material 1110 includes tungsten (W). The metal electrode is deposited by ALD, PVD, CVD, or other suitable process. In some other embodiments, the metal material 1110 includes aluminum (Al), copper (Cu) or other suitable conductive material.

A CMP process is applied to remove excessive the metal material 1110, the work function metal layer 1010, the barrier layer 710', and the dielectric layer 510' to provide a substantially planar top surface. The remaining metal material 1110, the remaining barrier layer 710', and the remaining dielectric layer 510' in the opening 505a form a gate stack G1 of an n-type device 10. The remaining metal material 1110, the remaining work function metal layer 1010, the remaining barrier layer 710', and the remaining dielectric layer 510' in the opening 505b form a gate stack G2 of a p-type device 20.

Moreover, the remaining metal material 1110, the remaining work function metal layer 1010, and the remaining dielectric layer 510' in the opening 505c form a test pattern P1, the remaining metal electrode 1110, the remaining work function metal layer 1010, and the remaining dielectric layer 510' in the opening 505d form a test pattern P2, and the remaining metal material 1110, the remaining work function metal layer 1010, and the remaining dielectric layer 510' in the opening 505e form a test pattern P3. The test pattern P1 covers the second portion 114b (see FIG. 4) of the semiconductor fin 114 and does not cover the first portion 114a (see FIG. 4) and the third portion 114c of the semiconductor fin 114. The remaining dielectric layer 510' in the opening 505d and the remaining dielectric layer 510' in the opening 505c (505e) have different ferroelectricity and the crystalline structures. In some embodiments, the remaining dielectric layer 510' in the opening 505d and the remaining dielectric layer 510' in the opening 505c (505e) have substantially the same thickness. The term "substantially" as used herein may be applied to modify any quantitative representation which could permissibly vary without resulting in a change in the basic function to which it is related.

In some embodiments, a layout area of the test pattern P1 (, P2, and/or P3) is greater than a layout area of the gate stack G1 (G2). For example, the layout area of the test pattern P1 (, P2, and/or P3) is in a range of about 10 times to about 10000 times of the layout area of the gate stack G1 (G2). It is noted that, in accordance with the practice in the industry, the gate stacks G1, G2 and the test patterns P1, P2, and P3 are not drawn to scale. In fact, the dimensions of the gate stacks G1, G2 and the test patterns P1, P2, and P3 in the figures may be arbitrarily increased or reduced for clarity of discussion. With such configuration, the test patterns P1, P2, and P3 provide sufficient area to perform the measurement processes mentioned above (such as the pre-test process 610 of FIGS. 9A and 9B and the post-test process 910 of FIGS. 12C and 12D). On the contrary, the layout areas of the gate stacks G1 and G2 are too small to perform the measurement processes.

Figure 16A:
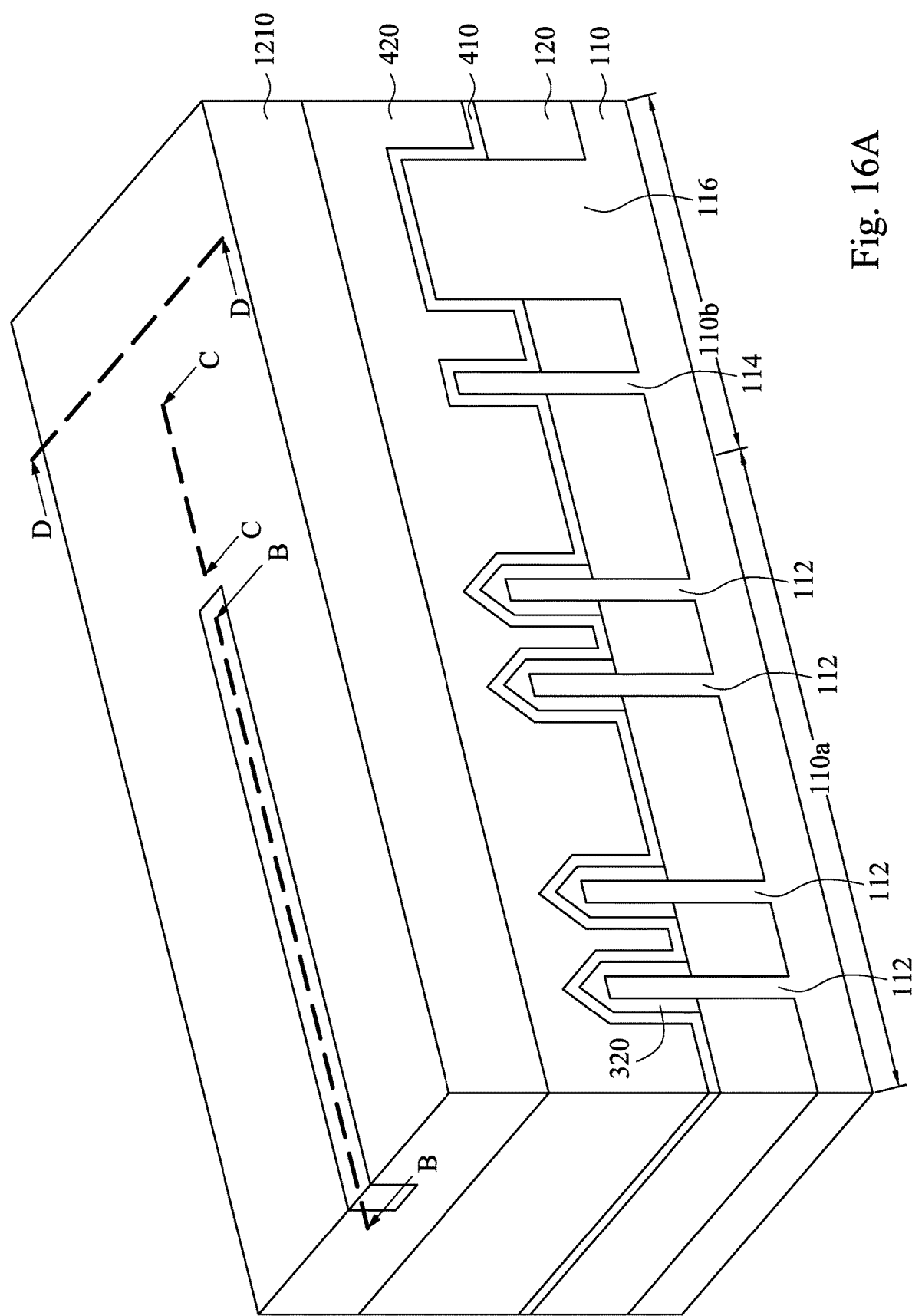
Figure 16B:
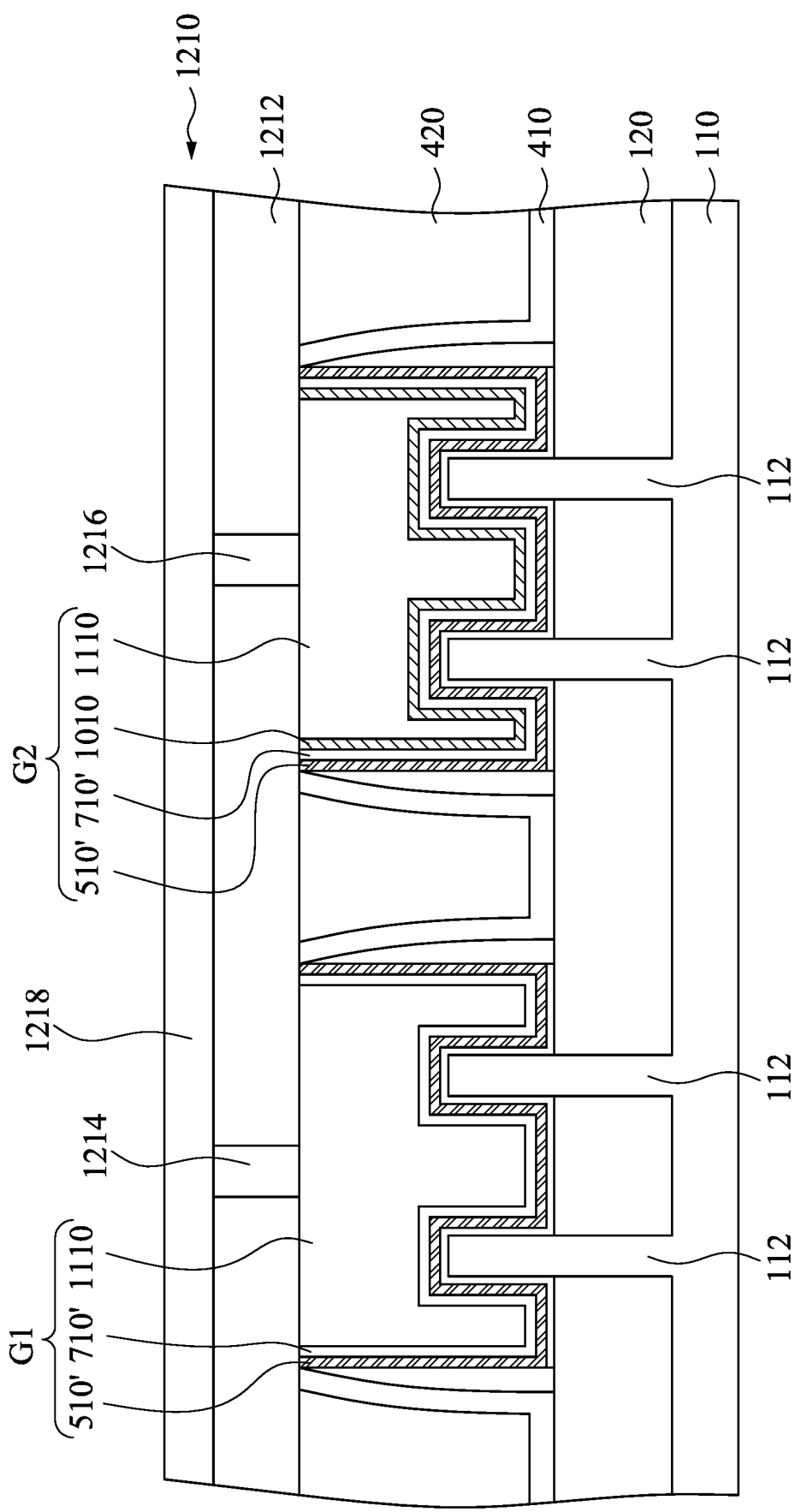
FIG. 16B is a cross-sectional view taking along line B-B of FIG. 16A.
Figure 16C:
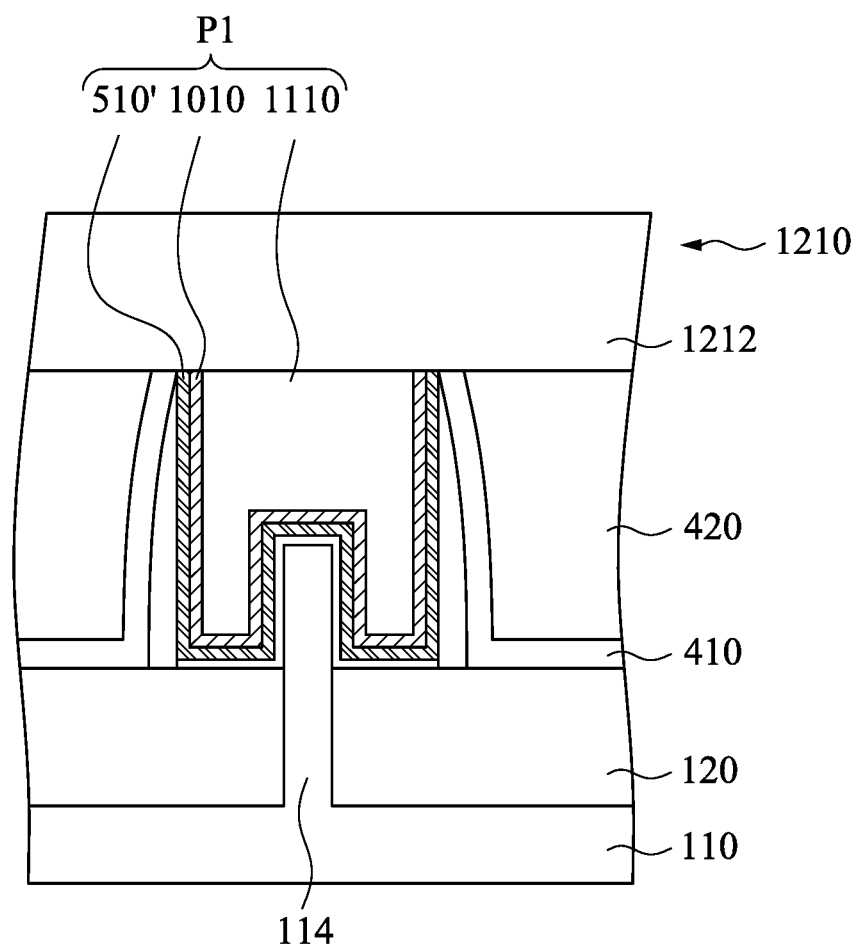
FIG. 16C is a cross-sectional view taking along line C-C of FIG. 16A.
Figure 16D:
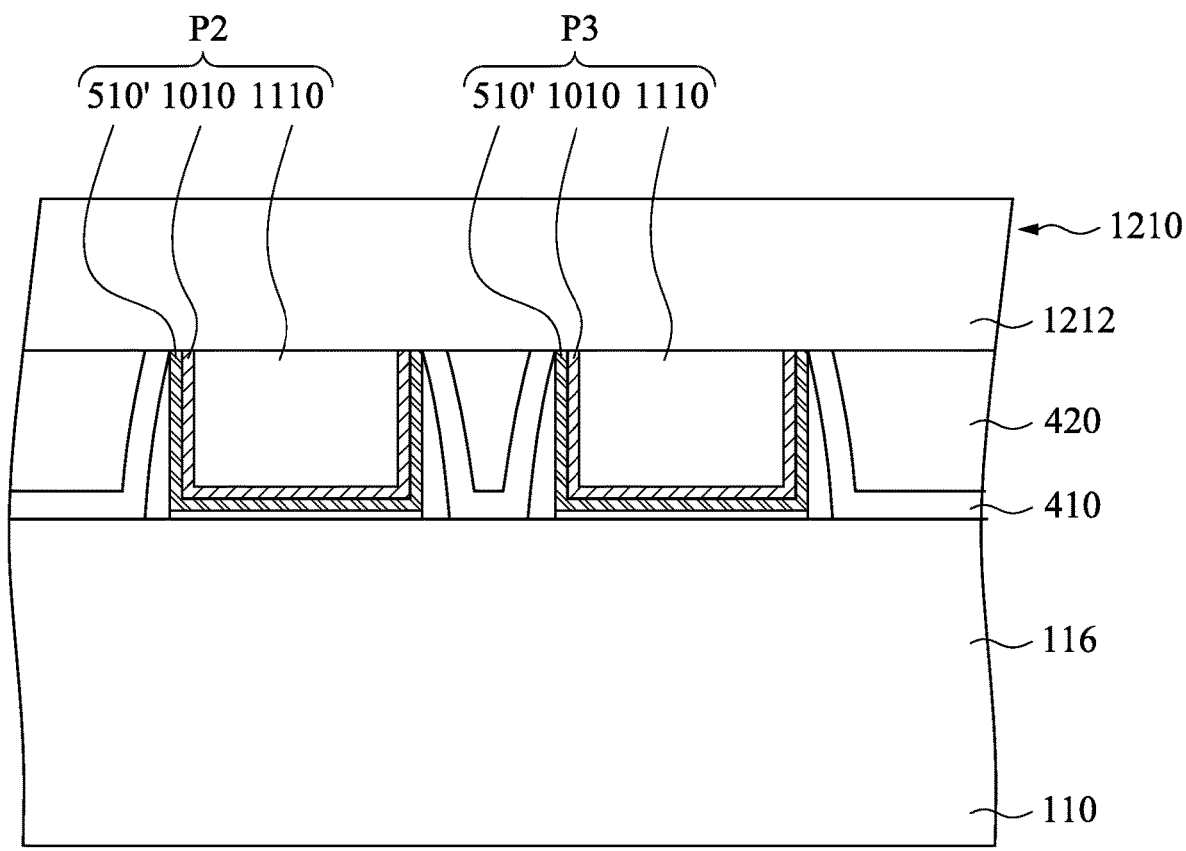
FIG. 16D is a cross-sectional view taking along line D-D of FIG. 16A.

Reference is made to FIGS. 16A to 16D, where FIG. 16B is a cross-sectional view taking along line B-B of FIG. 16A, FIG. 16C is a cross-sectional view taking along line C-C of FIG. 16A, and FIG. 16D is a cross-sectional view taking along line D-D of FIG. 16A. An interconnection structure 1210 is formed over the structure of FIG. 15A. Specifically, the interconnection structure 1210 includes an interlayer dielectric 1212 and conductors (such as vias 1214, 1216, and a conductive line 1218) in the interlayer dielectric 1212. The via 1214 interconnects the gate stack G1 and the conductive line 1218, and the via 1216 interconnects the gate stack G2 and the conductive line 1218. In some other embodiments, however, the interconnection structure 1210 are multilayers. For example, the interconnection structure 1210 have plural layers of conductive lines 1218, and the gate stack G1 is connected to one of the interconnection lines 1218 through the via 1214 while the gate stack G2 is connected to another of the interconnection lines 1218 through the via 1216.

On the other hand, the test patterns P1, P2, and P3 are electrically isolated from conductors in the interlayer dielectric 1212. That is, the test patterns P1, P2, and P3 are free from any vias and any conductive lines of the interconnection structure 1210. In other words, the interlayer dielectric 1212 completely covers the top surfaces of the test patterns P1, P2, and P3. As such, the test patterns P1, P2, and P3 can be considered to as "floating". That is, there is no electrical signal provided to the test patterns P1, P2, and P3.

According to FIGS. 4 to 16D, the semiconductor device includes an annealed dielectric layer 510'. The annealed dielectric layer 510' is ferroelectric. The ferroelectricity of the annealed dielectric layer 510' provides a negative capacitance. The use of ferroelectric materials with negative capacitance allows formation of the semiconductor device having lower subthreshold swing (SS) compared to the semiconductor device without the ferroelectric materials. Low SS allows for semiconductor device having higher switching speed compared to the semiconductor device without the ferroelectric materials. Moreover, the test patterns P1, P2, and P3 can be formed during fabrication. Furthermore, since the pre-test process(es) 610 and the post-test process(es) 910 are in-line monitoring, i.e., monitoring during fabrication, and non-destructively, the properties of the annealed dielectric layer 510' can be studied and controlled with short cycle time and low cost.

Figure 17A:
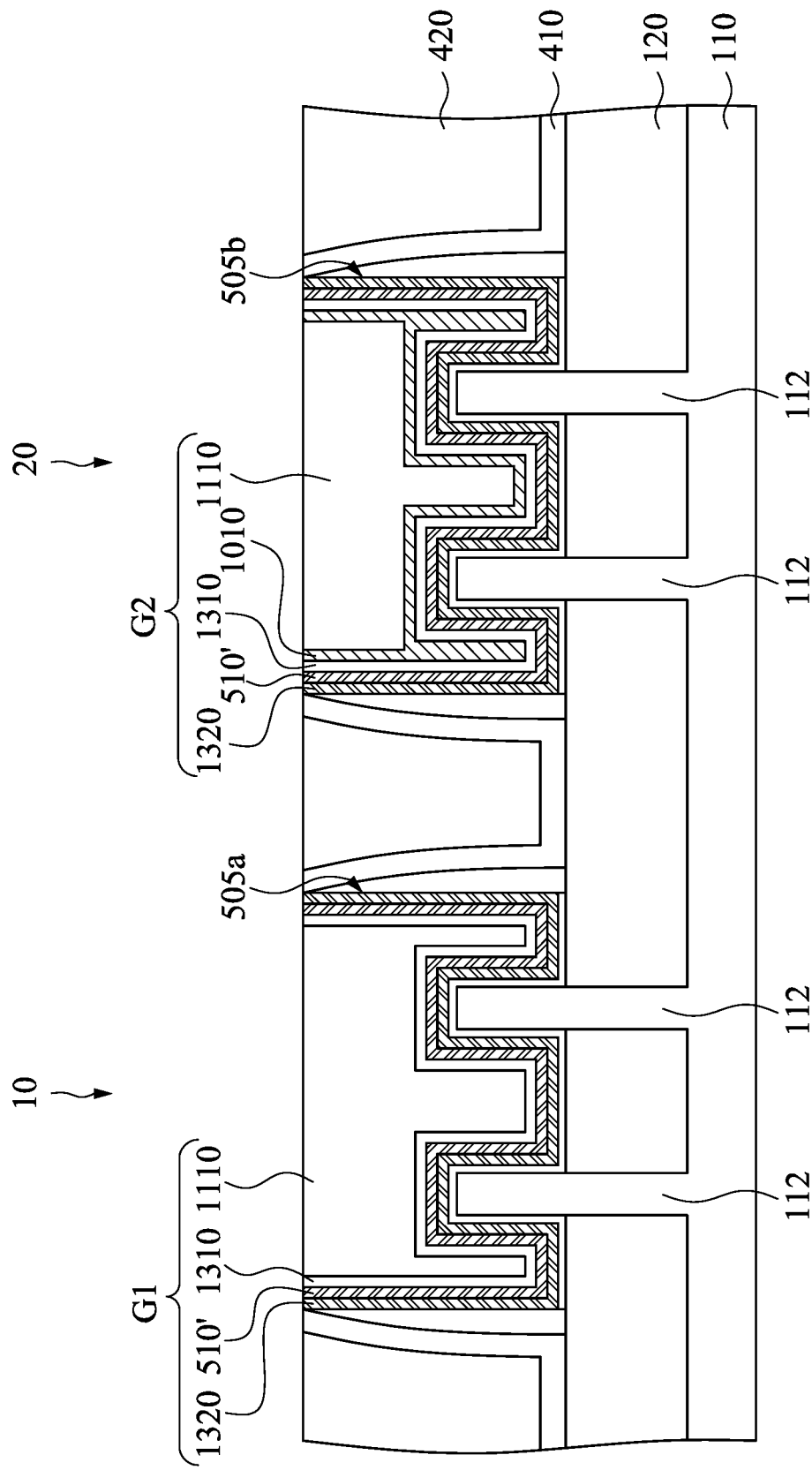
FIGS. 17A to 17C are cross-sectional views of a semiconductor device in accordance with some embodiments of the present disclosure.
Figure 17B:
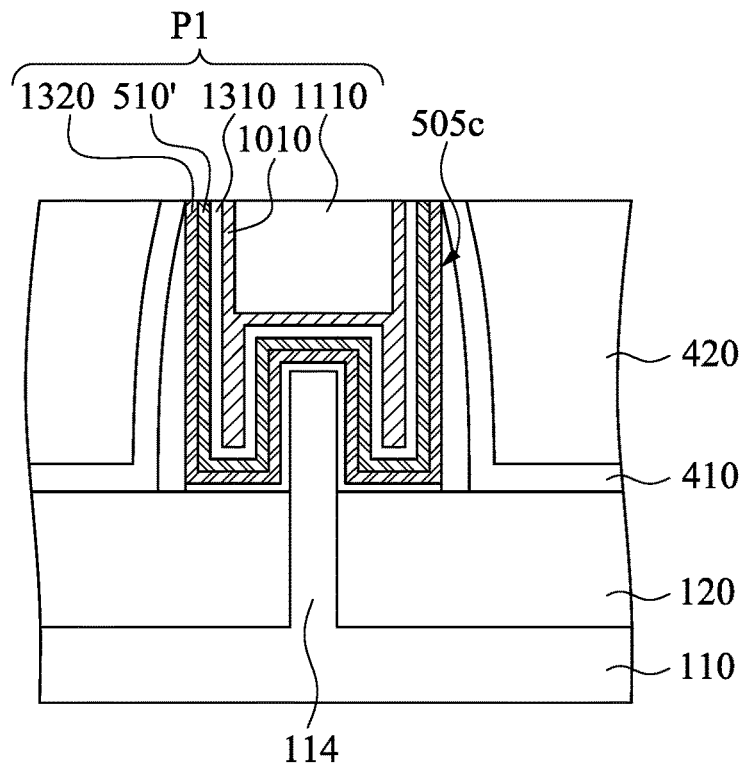
Figure 17C:
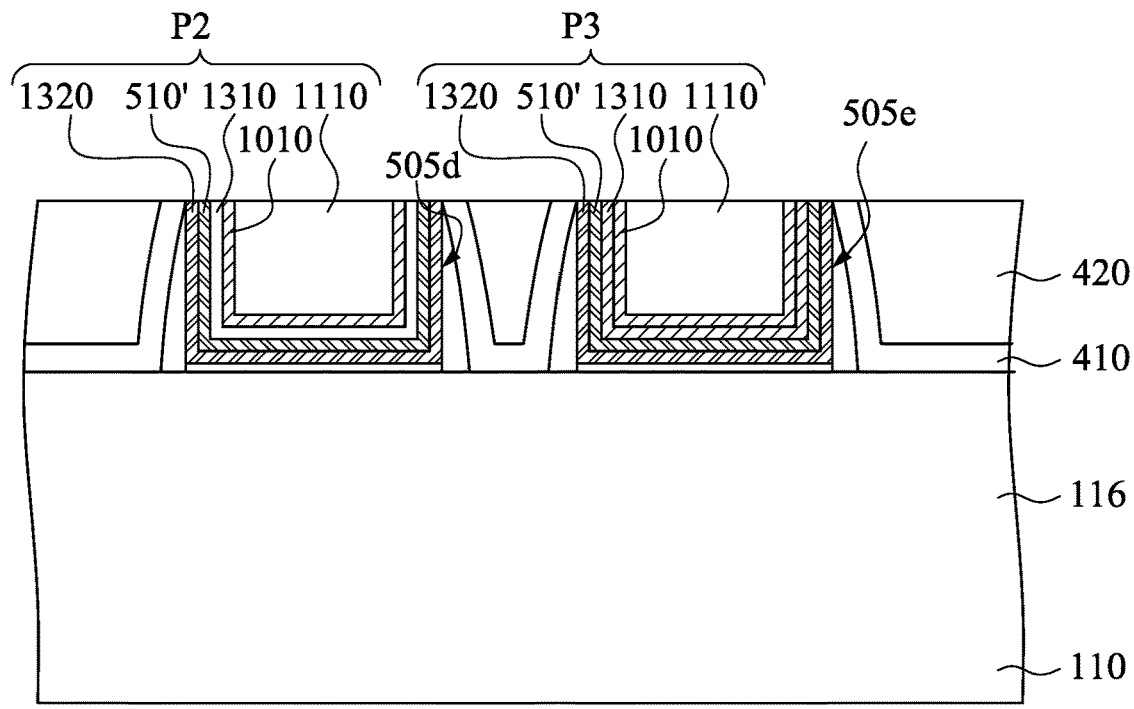

FIGS. 17A to 17C are cross-sectional views of a semiconductor device in accordance with some embodiments of the present disclosure, where cross-sectional positions of FIGS. 17A, 17B, and 17C are the same as the cross-sectional positions of FIGS. 15B, 15C, and 15D. In some embodiments, if the performance of annealed cap layer 710' (see FIG. 15B) is changed, the annealed cap layer 710' may not prevent inter-diffusion and reaction between the dielectric layer 510' and the work function metal layer 1010. As such, the annealed cap layer 710' is removed by performing, for example, an etching process.

A barrier layer 1310 is formed over the annealed dielectric layer 510' and before the formation of the work function metal layer 1010. The barrier layer 1310 conducts electricity and prevents inter-diffusion and reaction between metals, silicon or dielectric materials. The barrier layer 1310 may include refractory metals and their nitrides (e.g. TiN, TaN, $W_2N$, TiSiN, TaSiN). The barrier layer 1310 may be deposited by PVD, CVD, Metal-organic CVD (MOCVD) or ALD. In some embodiments, the barrier layer 1310 is not an annealed layer.

In some embodiments, a high-κ dielectric layer 1320 can be formed in the openings 505a-505b before the formation of the dielectric layer 510 (FIG. 8A) to improve the leakage current between the gate and the channel of the semiconductor device. The dielectric layer 510' and the high-κ dielectric layer 1320 have different ferroelectricity and the crystalline structures. For example, the dielectric layer 510' is ferroelectric and has an orthorhombic phase, and the high-κ dielectric layer 1320 is paraelectric and has an amorphous phase or other phase than orthorhombic.

The metal material 1110, the barrier layer 1310, the dielectric layer 510', and the high-κ dielectric layer 1320 in the opening 505a form a gate stack G1 of an n-type device 10. The metal material 1110, the work function metal layer 1010, the barrier layer 1310, the dielectric layer 510', and the high-κ dielectric layer 1320 in the opening 505b form a gate stack G2 of a p-type device 20.

It is note that the layout of the interconnection structure 1210 in FIG. 16A is illustrative, and should not limit the claimed scope of the present disclosure. A person having ordinary skill in the art may design suitable layouts for the interconnection structure 1210 according to actual situations. Furthermore, embodiments fall within the present disclosure as long as the gate stacks G1 and G2 are electrically connected to the any via and/or and conductive line of the interconnection structure 1210 and the test patterns P1, P2, and P3 are free from any via and/or and conductive line of the interconnection structure 1210.

In FIG. 17B, the metal material 1110, the work function metal layer 1010, the barrier layer 1310, the dielectric layer 51, the high-κ dielectric layer 1320 in the opening 505c form a test pattern P1. In FIG. 17C, the metal material 1110, the work function metal layer 1010, the barrier layer 1310, the dielectric layer 510, and the high-κ dielectric layer 1510 in the opening 505d form a test pattern P2, and the metal material 1110, the work function metal layer 1010, the dielectric layer 510', and the high-κ dielectric layer 1310 in the opening 505e form a test pattern P3. In some embodiments, the high-κ dielectric layer 1320 can be omitted. In some other embodiments, the high-κ dielectric layer 1320 can be added in FIGS. 15A to 15D. Other relevant structural details of the semiconductor device in FIGS. 17A to 17C are similar to the semiconductor device in FIGS. 15A to 15D, and, therefore, a description in this regard will not be repeated hereinafter.

According to the embodiments, the semiconductor device includes an annealed dielectric layer. The annealed dielectric layer is ferroelectric. The ferroelectricity of the annealed dielectric layer provides a negative capacitance. The use of ferroelectric materials with negative capacitance allows formation of the semiconductor device having lower subthreshold swing (SS) compared to the semiconductor device without the ferroelectric materials. Low SS allows for semiconductor device having higher switching speed compared to the semiconductor device without the ferroelectric materials. Furthermore, since the pre-test process(es) and the post-test process(es) are in-line monitoring, i.e., monitoring during fabrication, and non-destructively, the properties of the annealed dielectric layer can be studied and controlled with short cycle time and low cost.

According to some embodiments, a method includes forming a dummy pattern over test region of a substrate; forming an interlayer dielectric (ILD) layer laterally surrounding the dummy pattern; removing the dummy pattern to form an opening; forming a dielectric layer in the opening; performing a first testing process on the dielectric layer; performing an annealing process to the dielectric layer; and performing a second testing process on the annealed dielectric layer.

According to some embodiments, a method includes forming first and second dummy patterns over a test region of a substrate; forming an interlayer dielectric (ILD) layer laterally surrounding the first and second dummy patterns; removing the first and second dummy patterns to form first and second openings in the ILD layer; forming a dielectric layer over the substrate, in which the dielectric layer has a first portion in the first opening of the ILD layer and a second portion in the second opening of the ILD layer; forming a cap layer in the first opening and over the first portion of the dielectric layer, while the cap layer is not formed in the second opening; performing an annealing process to the dielectric layer; and in-line testing properties of the first and second portions of the dielectric layer after performing the annealing process.

According to some embodiments, a method includes forming a dielectric layer over a substrate, in which the dielectric layer has a first portion in a device region of the substrate and a second portion in a test region of the substrate; forming a cap layer over the dielectric layer; annealing the dielectric layer and the cap layer; removing a portion of the cap layer to expose the second portion of the dielectric layer, while the first portion of the dielectric layer is covered by a remaining portion of the cap layer; in-line testing properties of the second portion of dielectric layer after removing the portion of the cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dummy pattern over a test region of a substrate;
   forming an interlayer dielectric (ILD) layer laterally surrounding the dummy pattern;
   removing the dummy pattern to form an opening;
   forming a dielectric layer in the opening;
   performing a first testing process on the dielectric layer;
   performing an annealing process to the dielectric layer; and
   performing a second testing process on the annealed dielectric layer.

2. The method of claim 1, further comprising forming a cap layer after performing the first testing process and prior to performing the annealing process.

3. The method of claim 2, further comprising removing the cap layer after performing the annealing process.

4. The method of claim 1, wherein the annealed dielectric layer extends to a top surface of the ILD layer during performing the second testing process.

5. The method of claim 4, further comprising:
   forming a metal layer over the dielectric layer after performing the second testing process; and
   performing a CMP process is performed to remove portions of the annealed dielectric layer from the top surface of the ILD layer.

6. The method of claim 1, wherein the first testing process and the second testing process comprises testing a ferroelectricity, a crystalline structure, and a thickness of the dielectric layer.

7. A method, comprising:
   forming first and second dummy patterns over a test region of a substrate;
   forming an interlayer dielectric (ILD) layer laterally surrounding the first and second dummy patterns;
   removing the first and second dummy patterns to form first and second openings in the ILD layer;
   forming a dielectric layer over the substrate, wherein the dielectric layer has a first portion in the first opening of the ILD layer and a second portion in the second opening of the ILD layer;
   forming a cap layer in the first opening and over the first portion of the dielectric layer, while the cap layer is not formed in the second opening;
   performing an annealing process to the dielectric layer; and
   in-line testing properties of the first and second portions of the dielectric layer after performing the annealing process.

8. The method of claim 7, wherein forming the cap layer comprises:
   forming a cap layer material over the first and second openings; and
   patterning the cap layer material to remove a portion of the cap layer material from the second opening.

9. The method of claim 7, wherein in-line testing properties of the first and second portions of the dielectric layer after performing the annealing process comprises determine whether the first portion of the dielectric layer is ferroelectric.

10. The method of claim 7, wherein forming the cap layer is performed such that a portion of a top surface of the ILD layer is covered by the cap layer.

11. The method of claim 10, further comprising removing the cap layer to expose the portion of the top surface of the ILD layer prior to in-line testing properties of the first and second portions of the dielectric layer.

12. The method of claim 7, wherein the first portion of the dielectric layer is ferroelectric and the second portion of the dielectric layer is not ferroelectric after the annealing process.

13. The method of claim 7, further comprising in-line testing properties of the first and second portions of the dielectric layer prior to forming the cap layer.

14. A method, comprising:
   forming a dielectric layer over a substrate, wherein the dielectric layer has a first portion in a device region of the substrate and a second portion in a test region of the substrate;
   forming a cap layer over the dielectric layer;
   annealing the dielectric layer and the cap layer;
   removing a portion of the cap layer to expose the second portion of the dielectric layer, while the first portion of the dielectric layer is covered by a remaining portion of the cap layer; and
   in-line testing properties of the second portion of dielectric layer after removing the portion of the cap layer.

15. The method of claim 14, wherein the first portion of the dielectric layer is formed over a semiconductor fin protruding from the substrate, and the second portion of the dielectric layer is formed over a testing feature protruding from the substrate, and the testing feature is wider than the semiconductor fin.

16. The method of claim 15, further comprising:
   forming a dummy gate over the semiconductor fin and a dummy pattern over the testing feature, wherein the dummy pattern is wider than the dummy gate; and
   removing the dummy gate and the dummy pattern to form first and second openings, wherein the first portion of the dielectric layer is formed in the first opening and the second portion of the dielectric layer is formed in the second opening.

17. The method of claim 16, wherein the dummy gate covers opposite sidewalls of the semiconductor fin and sidewalls of the testing feature are free of coverage by the dummy pattern.

18. The method of claim 14, further comprising forming a metal material over the dielectric layer, wherein the metal material is separated from the first portion of the dielectric layer by the remaining portion of the cap layer, and the metal material is in contact with the second portion of the dielectric layer.

19. The method of claim 14, further comprising in-line testing properties of the second portion of the dielectric layer prior to forming the cap layer.

20. The method of claim 14, further comprising:
   determining whether the second portion of the dielectric layer is orthorhombic crystalline structure after removing the portion of the cap layer; and
   if the second portion of the dielectric layer is not orthorhombic crystalline structure, the second portion of the dielectric layer is considered failed.

* * * * *